United States Patent
Tanaka

(10) Patent No.: US 8,470,643 B2
(45) Date of Patent: Jun. 25, 2013

(54) MANUFACTURING METHOD OF SEMICONDUCTOR PACKAGES

(75) Inventor: Koichi Tanaka, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 249 days.

(21) Appl. No.: 13/166,921

(22) Filed: Jun. 23, 2011

(65) Prior Publication Data

US 2011/0318878 A1    Dec. 29, 2011

(30) Foreign Application Priority Data

Jun. 28, 2010  (JP) .................................. 2010-146769

(51) Int. Cl.
    *H01L 21/60*  (2006.01)
(52) U.S. Cl.
    USPC ......................................... 438/113; 257/509
(58) Field of Classification Search
    USPC .................................. 438/113; 257/E21.509
    See application file for complete search history.

(56) References Cited

U.S. PATENT DOCUMENTS

| 2008/0002460 | A1* | 1/2008  | Tuckerman et al. | 365/158 |
| 2009/0008765 | A1  | 1/2009  | Yamano et al.    |         |
| 2011/0128713 | A1* | 6/2011  | Kawano et al.    | 361/784 |
| 2011/0260338 | A1* | 10/2011 | Lee et al.       | 257/778 |
| 2012/0286418 | A1* | 11/2012 | Lee et al.       | 257/737 |
| 2013/0087921 | A1* | 4/2013  | Wahl             | 257/773 |

FOREIGN PATENT DOCUMENTS

JP    2008-135781    6/2008

* cited by examiner

*Primary Examiner* — Alexander Ghyka
*Assistant Examiner* — Stanetta Isaac
(74) *Attorney, Agent, or Firm* — IPUSA, PLLC

(57) ABSTRACT

Conductive core balls are joined to joint pads formed on an upper substrate. Core balls are joined to joint pads formed on an extending part of an upper-substrate substrate material. The joint pads formed on the extending part of the upper-substrate substrate material are joined to the joint pads formed on an extending part of a lower-substrate substrate material via the core balls. The joint pads formed in an area corresponding to the upper substrate of the upper-substrate substrate material are connected to the joint pads formed in an area corresponding to a lower substrate of the lower-substrate substrate material via the core balls and the conductive core balls. The upper-substrate substrate material is fixed to the lower-substrate substrate material by a mold resin supplied therebetween. The extending parts of the upper-substrate substrate material and the lower-substrate substrate material are removed, and the semiconductor packages are individualized.

6 Claims, 18 Drawing Sheets

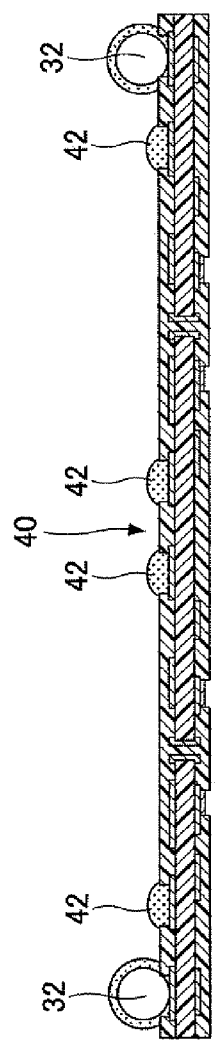
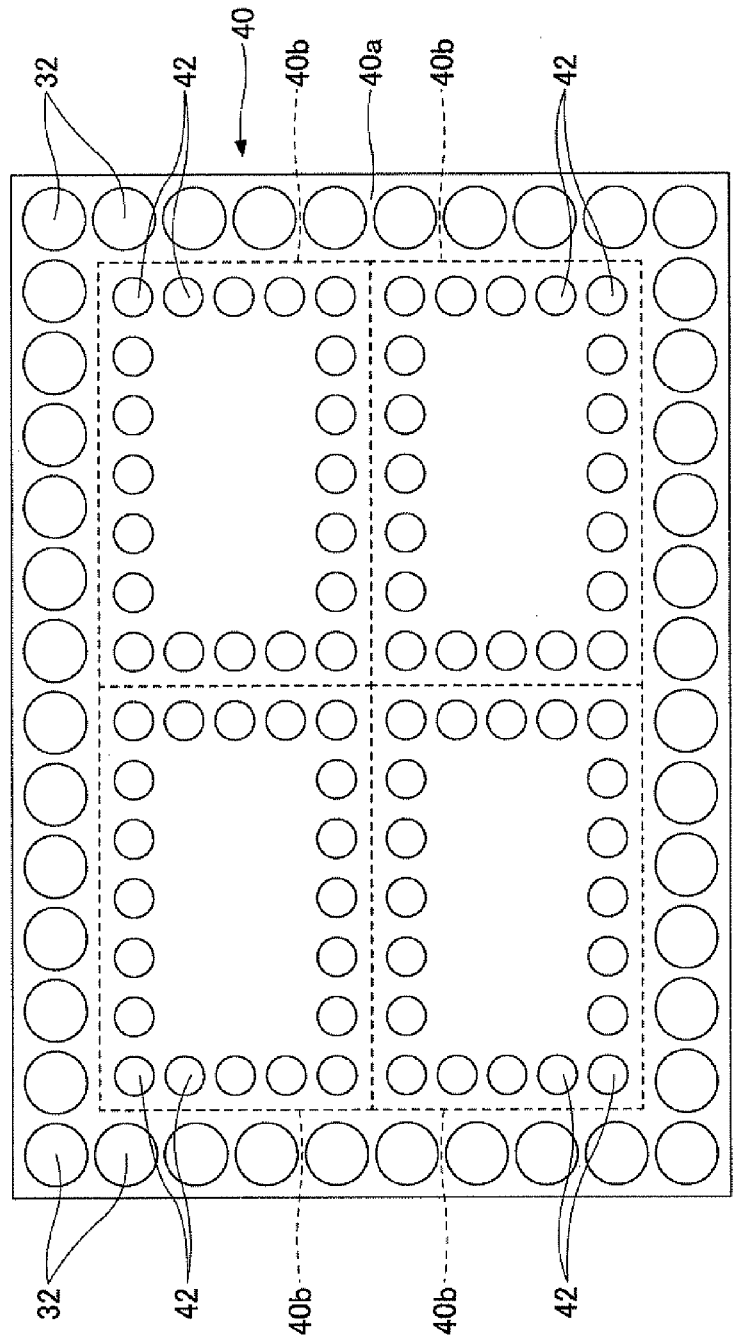
FIG.4A
FIG.4B

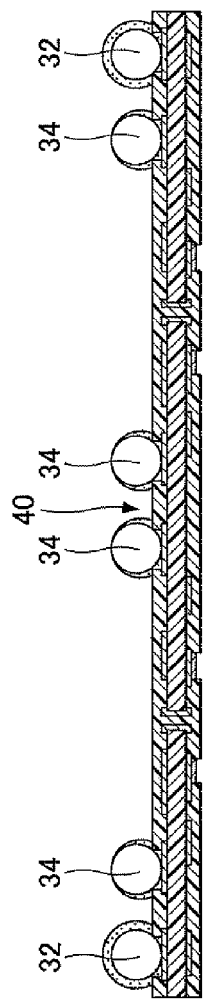
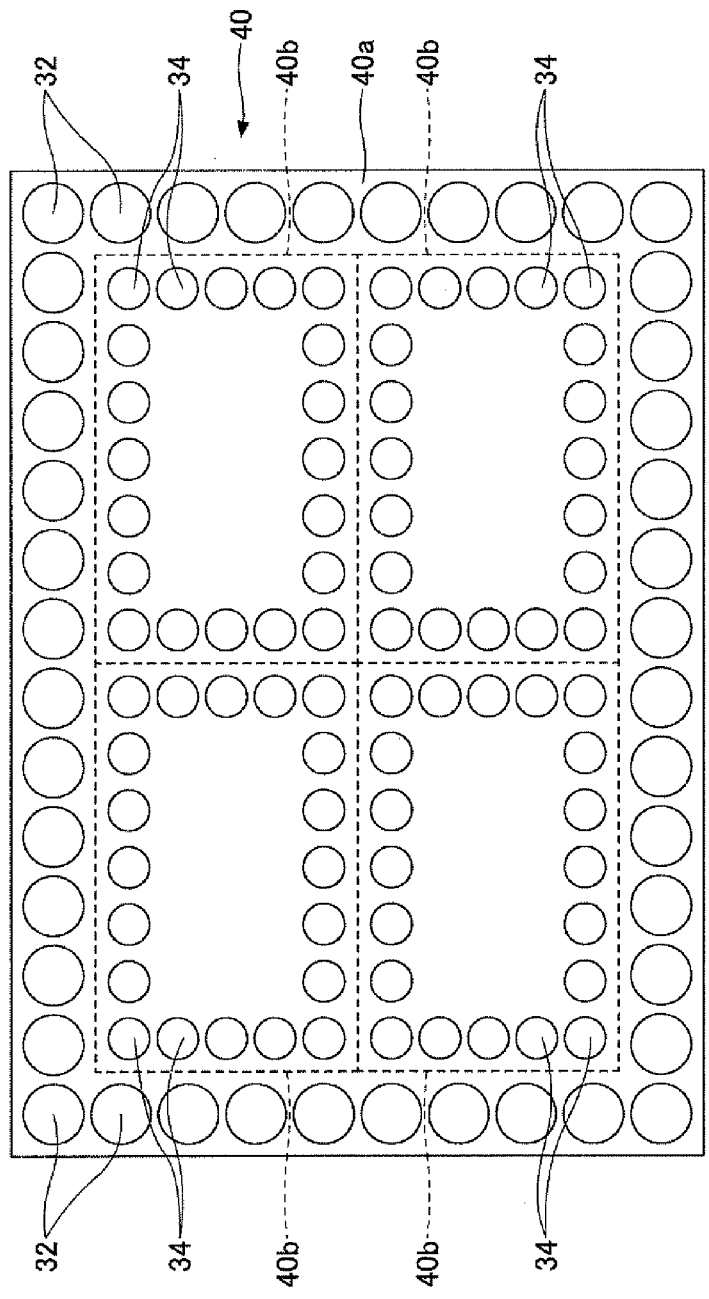
FIG.5A
FIG.5B

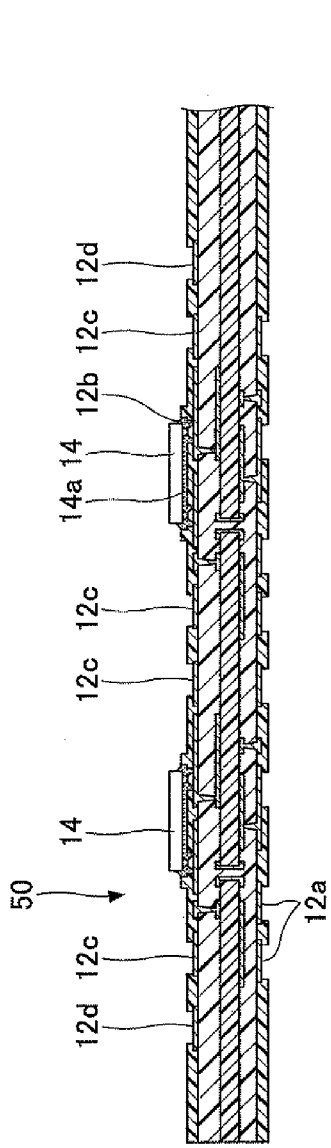
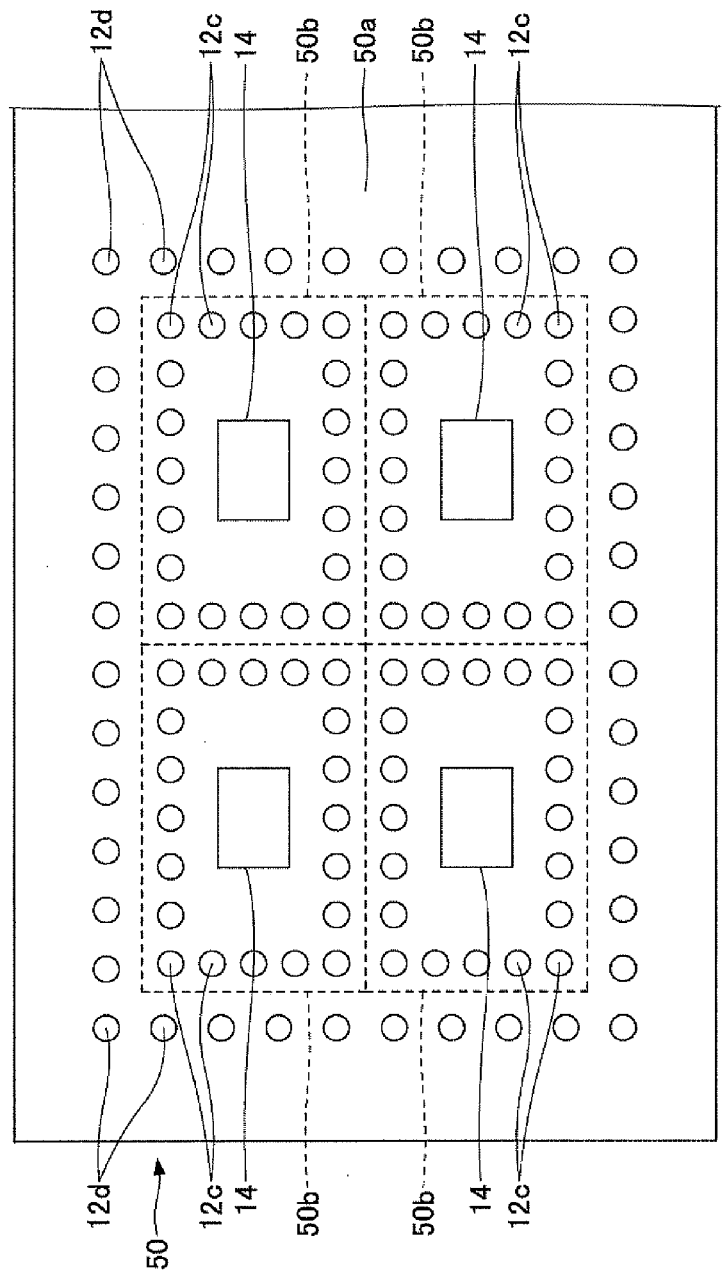
FIG.6A
FIG.6B

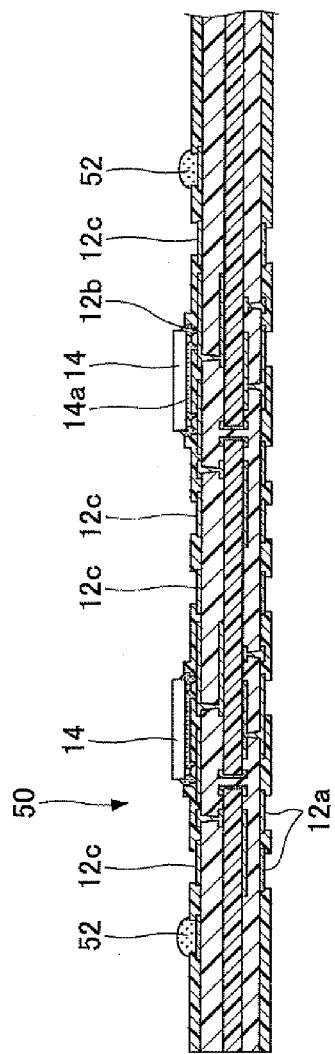
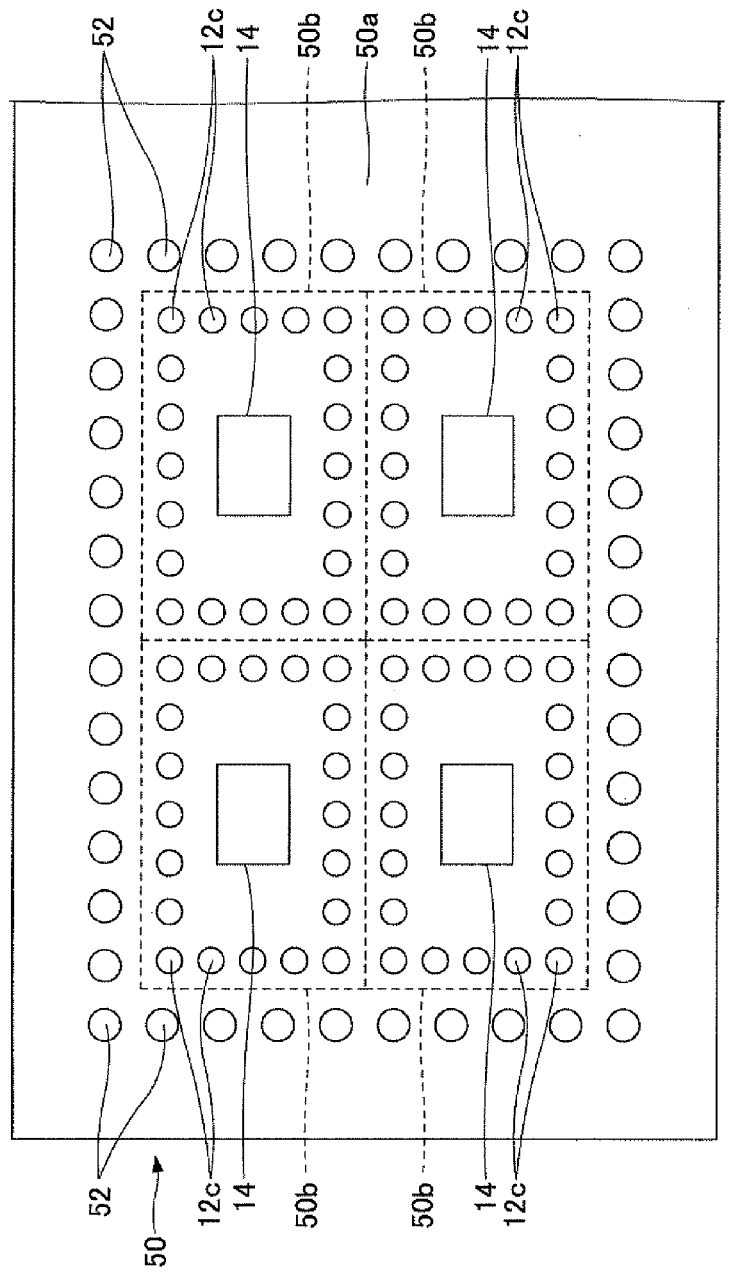
FIG.7A
FIG.7B

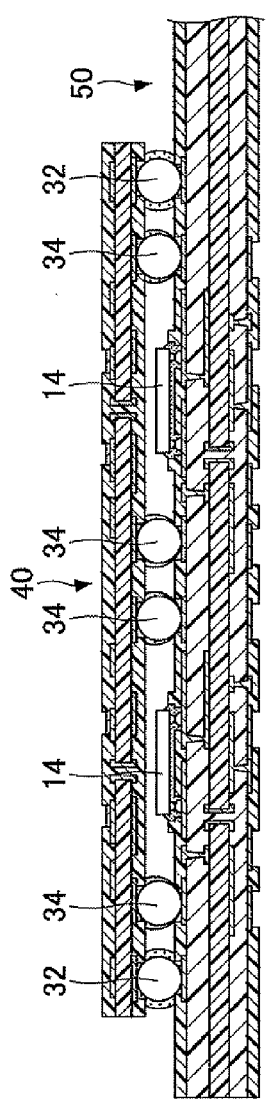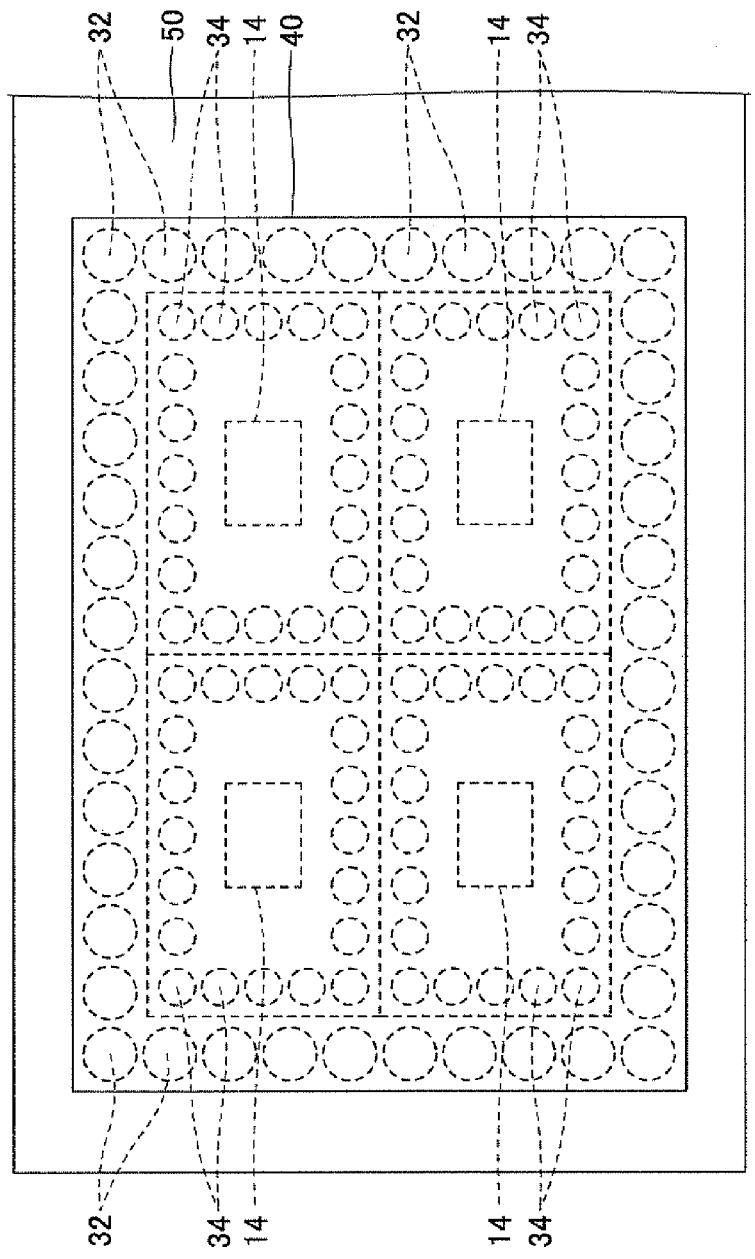
FIG.8A
FIG.8B

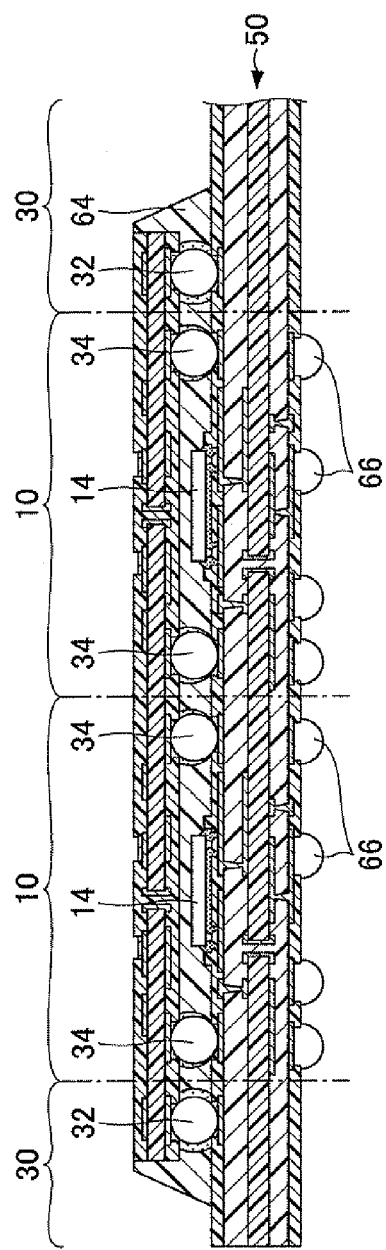
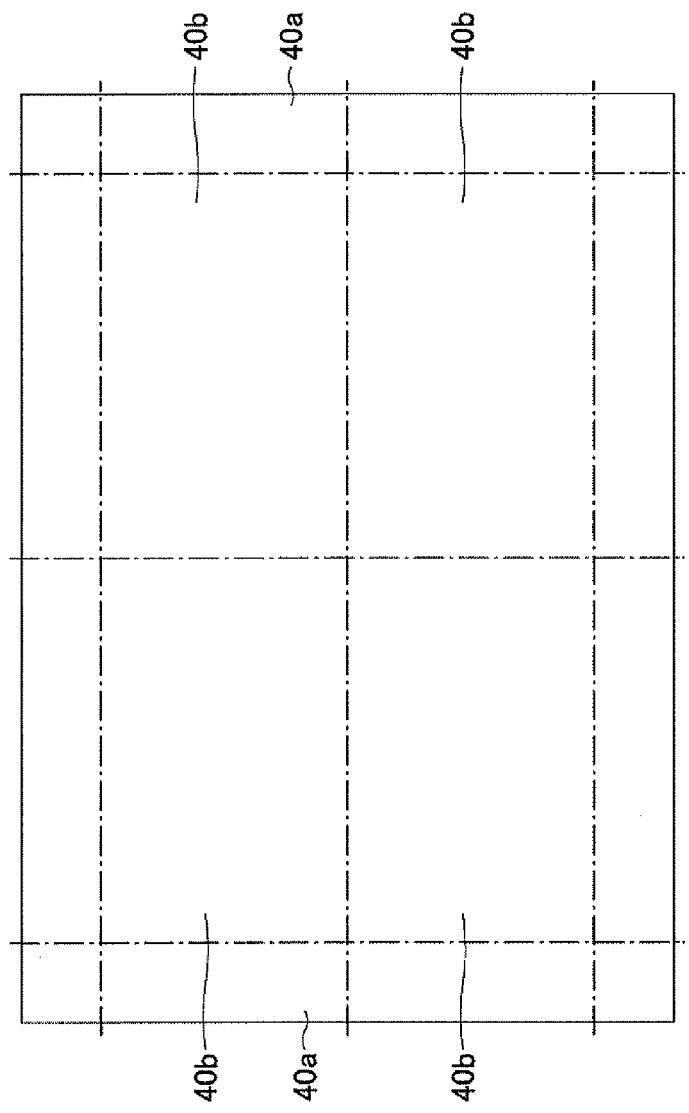
FIG.11A
FIG.11B

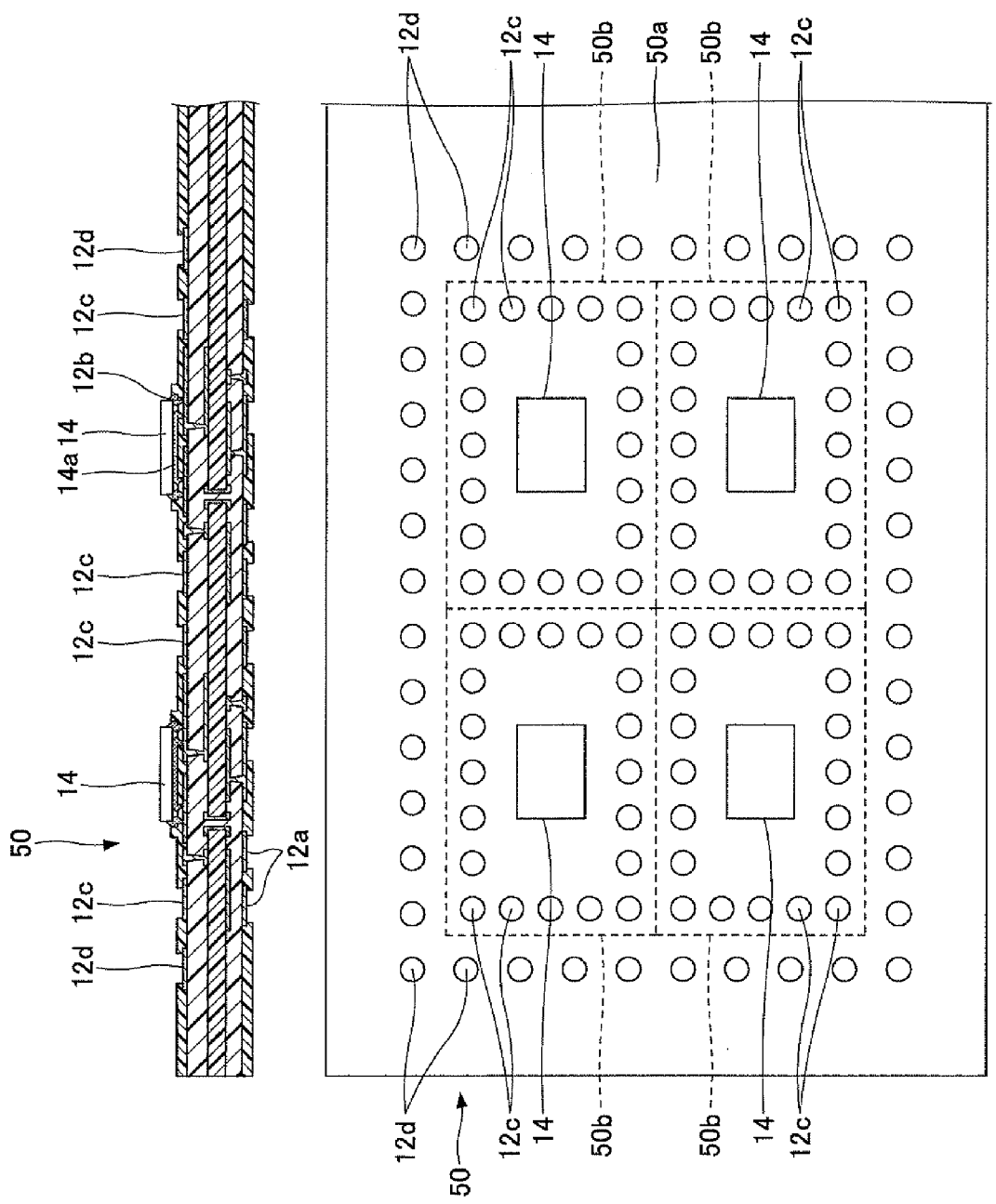

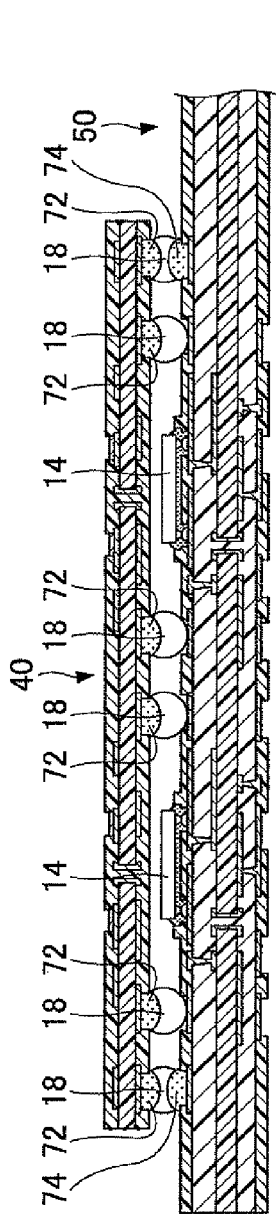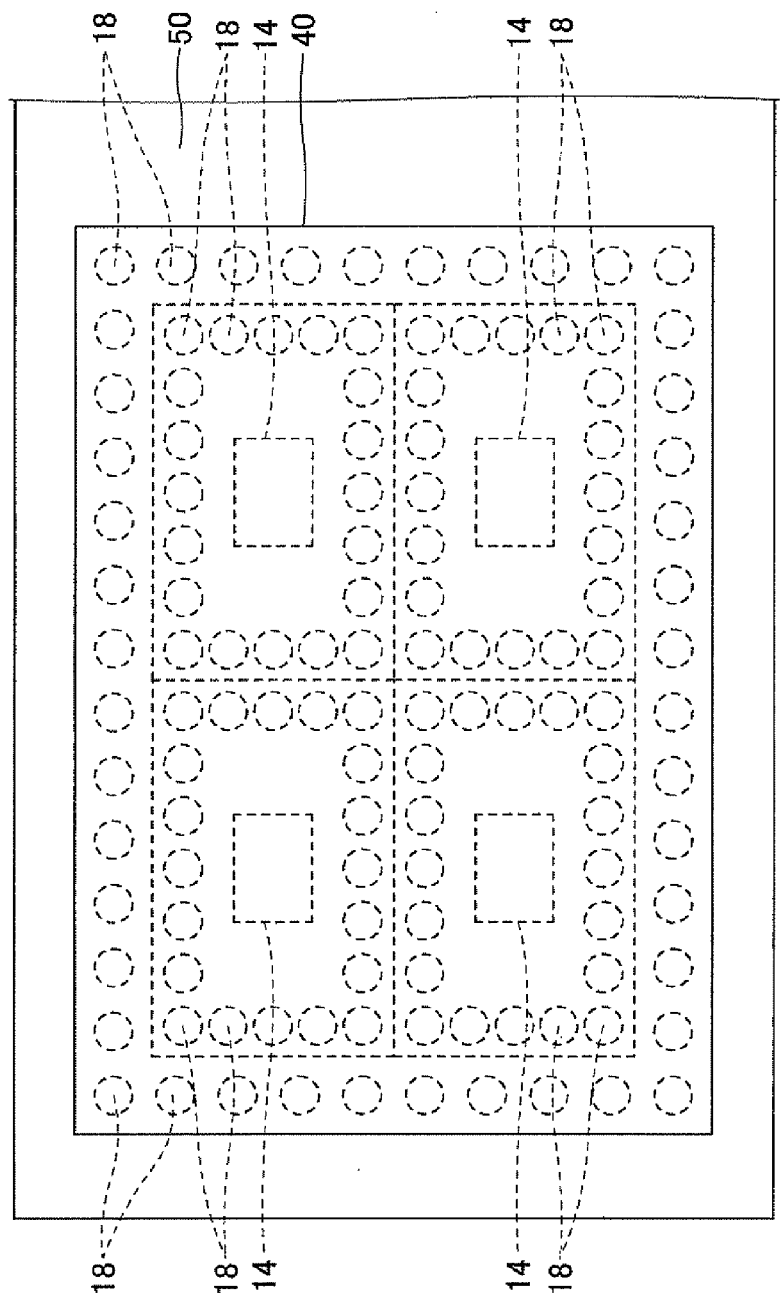
FIG.17A
FIG.17B

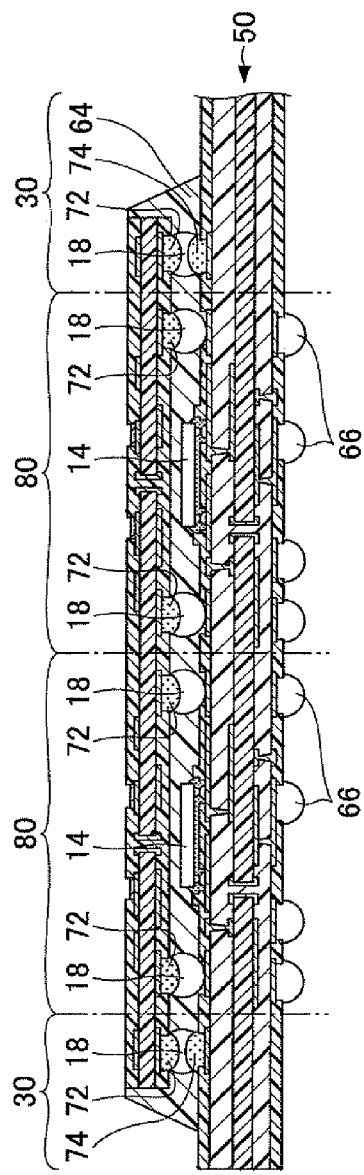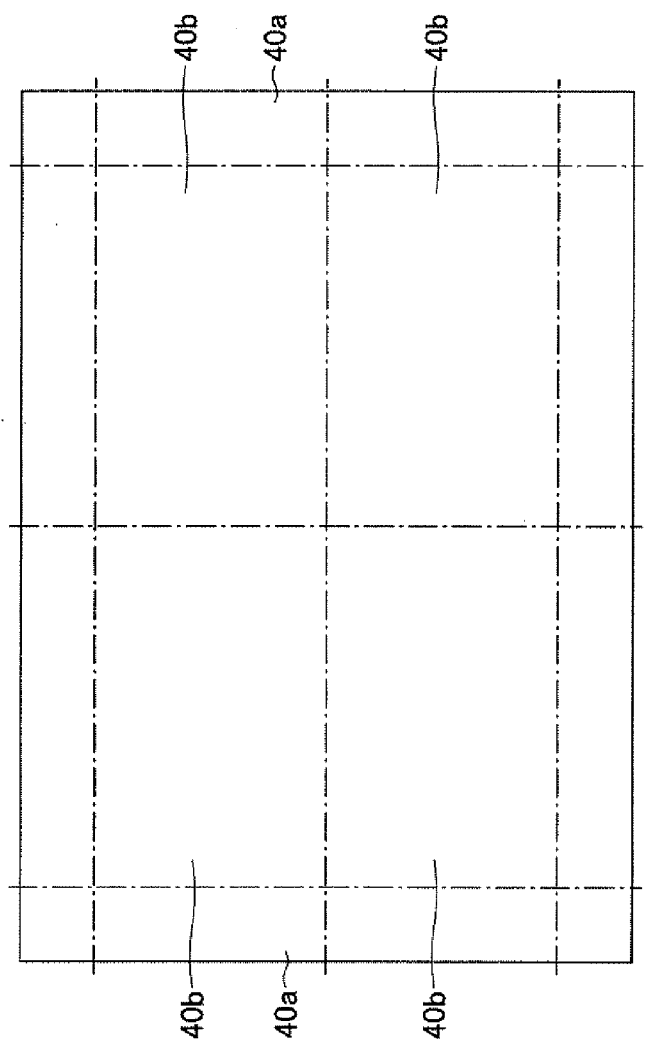
FIG.20A
FIG.20B

MANUFACTURING METHOD OF SEMICONDUCTOR PACKAGES

CROSS-REFERENCE TO RELATED APPLICATIONS

This application is based upon and claims the benefit of priority of the prior Japanese Patent Application No. 2010-146769, filed on Jun. 28, 2010, the entire contents of which are incorporated herein by reference.

FIELD

The embodiment discussed herein is directed to a manufacturing method of semiconductor packages in each of which a semiconductor element is arranged between upper and lower substrates.

BACKGROUND

Japanese Laid-Open Patent Application No. 2008-135781 suggests a semiconductor package, which is formed by arranging a semiconductor element between upper and lower substrates and filling a mold resin in the circumference of the semiconductor element. The upper substrate is fixed to the lower substrate via spacer members to maintain an interval between the upper and lower substrates, and the mold resin is filled between the upper and lower substrates. The upper substrate and the lower substrate are electrically connectable through the spacer members. External connection terminals are provided on the backside of the lower substrate so that electronic parts can be mounted on the upper substrate.

In the semiconductor package having the above-mentioned structure, it is suggested to use a copper-core solder ball as a spacer member. The copper-core solder ball includes a copper-core ball and a solder covering the circumference of the copper-core ball. The solder serves as a joining material, and the copper-core ball serves as a spacer. That is, connection pads of the upper substrate and connection pads of the lower substrate are joined by solder by reflowing the solder in a state where the copper-core solder balls are sandwiched between the connection pads of the upper substrate and the connection pads of the lower substrate, respectively. The copper-core balls inside solder are set in a state where the copper-core balls are sandwiched between the upper substrate and the lower substrate. Thereby, each of the copper-core balls can serve as a spacer. Therefore, a distance between the upper substrate and the lower substrate is determined according to the size of the copper-core balls, and can be maintained constant.

After connecting the upper substrate and the lower substrate using the copper-core solder balls, the mold resin is filled between the upper substrate and the lower substrate so that the upper substrate and the lower substrate are fixed surely to each other. Thus, the semiconductor element and the copper-core solder balls mounted on the lower substrate are embedded in the mold resin.

When the upper substrate and the lower substrate are connected and fixed by copper-core solder balls as mentioned above, the copper-core balls and the solder are confined within the mold resin. When reflowing solder balls, which serve as external connection terminals of the semiconductor package, the solder in the circumference of the copper-core balls inside the mold resin is also melted due to heat applied by the reflow.

If the copper-core balls are heated at a temperature at which the solder is melted in the circumference of the copper-core balls, the copper-core balls and the solder are subjected to thermal expansion, and, thereby, a volume thereof tends to increase. However, because the copper-core balls and the solder are confined within the mold resin, the pressure of the melted solder is increased. Then, if there is a portion where adhesion is weak in portions where the mold resin adheres to the upper substrate and the lower substrate, the melted solder may intrude into the weak-adhesion portion.

For example, if there is such a weak-adhesion portion between the mold resin and a solder resist on the substrate or between the solder resist and a wiring pattern, the melted solder intrudes into the weak-adhesion portion while pealing the mold resin or the solder resist. If the solder intrudes along the solder resist or the wiring pattern, adjacent connection pads may be short-circuited or the wiring pattern may be short-circuited due to the intruding solder.

Thus, it is desirable to develop a technique according to which a melted solder within a mold resin does not cause the above-mentioned problem even if an upper substrate and a lower substrate are connected using a copper-core solder ball as a spacer member.

SUMMARY

There is provided according to an aspect of the invention, a manufacturing method of manufacturing a plurality of semiconductor packages at one time, each of the semiconductor packages including: an upper substrate and a lower substrate connected to each other via spacer members; a semiconductor element located between the upper substrate and the lower substrate and mounted on the lower substrate; and a mold resin filled in a space between the upper substrate and the lower substrate, the manufacturing method comprising: preparing an upper-substrate substrate material including the upper substrate and an extending part in a circumference of the upper substrate, joining conductive core balls as the spacer members to joint pads formed on the upper substrate and also joining core balls to joint pads formed on the extending part, and preparing a lower-substrate substrate material including the lower substrate and an extending part in a circumference of the lower substrate; joining the joint pads formed on the extending part of the upper-substrate substrate material to the joint pads formed on the extending part of the lower-substrate substrate material via the core balls, and connecting the upper-substrate substrate material to the lower-substrate substrate material by electrically connecting the joint pads formed in an area corresponding to the upper substrate of the upper-substrate substrate material to the joint pads formed in an area corresponding to the lower substrate of the lower-substrate substrate material via the core balls and the conductive core balls; fixing the upper-substrate substrate material to the lower-substrate substrate material by filling a mold resin between the upper-substrate substrate material and the lower-substrate substrate material;
removing a portion including the extending part of the upper-substrate substrate material and the extending part of the lower-substrate substrate material; and individualizing the semiconductor packages.

Because the upper substrate and the lower substrate are joined to each other by the solder provided on the circumferences of the copper-core balls arranged between the extending parts of the upper-substrate substrate material and the lower-substrate substrate material and the extending parts including the copper-core balls are removed when individualizing the semiconductor packages, a large amount of solder is not confined within the mold resin of the semiconductor packages. Thus, even if the semiconductor packages are heated, the solder within the mold resin does not intrude into a part of the mold resin having a weak adhesion, thereby preventing wiring patterns from short-circuiting.

The object and advantages of the embodiment will be realized and attained by means of the elements and combinations particularly pointed out in the appended claims.

It is to be understood that both the foregoing general description and the following detailed description are exemplary explanatory only and are not restrictive of the invention, as claimed.

BRIEF DESCRIPTION OF DRAWINGS

FIG. 4A is a cross-sectional view of the upper-substrate substrate material in a dummy ball mounting process;

FIG. 4B is a plan view of the upper-substrate substrate material illustrated in FIG. 4A;

FIG. 5A is a cross-sectional view of the upper-substrate substrate material in a copper-core solder ball mounting process;

FIG. 5B is a plan view of the upper-substrate substrate material illustrated in FIG. 5A;

FIG. 6A is a cross-sectional view of a lower-substrate substrate material in a semiconductor element mounting process;

FIG. 6B is a plan view of the lower-substrate substrate material illustrated in FIG. 6A;

FIG. 7A is a cross-sectional view of the lower-substrate substrate material in a flux applying process;

FIG. 7B is a plan view of the lower-substrate substrate material illustrated in FIG. 7A;

FIG. 8A is a cross-sectional view of an assembly of the upper-substrate substrate material and the lower-substrate substrate material in a process of mounting the upper-substrate substrate material onto the lower-substrate substrate material:

FIG. 8B is a plan view of the assembly illustrated in FIG. 8A;

FIG. 11A is a cross-sectional view of the assembly of the lower-substrate substrate material and the upper-substrate substrate material in a process of individualizing semiconductor packages;

FIG. 11B is a plan view of the assembly of the lower-substrate substrate material and the upper-substrate substrate material illustrated in FIG. 11A;

FIG. 15A is a cross-sectional view of a lower-substrate substrate material in a semiconductor element mounting process;

FIG. 15B is a plan view of the lower-substrate substrate material illustrated in FIG. 15A;

FIG. 17A is a cross-sectional view of an assembly of the upper-substrate substrate material and the lower-substrate substrate material in a process of mounting the upper-substrate substrate material onto the lower-substrate substrate material:

FIG. 17B is a plan view of the assembly illustrated in FIG. 17A;

FIG. 20A is a cross-sectional view of the assembly of the upper-substrate substrate material and the lower-substrate substrate material in a process of individualizing semiconductor packages; and FIG. 20B is a plan view of the assembly of the upper-substrate substrate material and the lower-substrate substrate illustrated in FIG. 20A.

DESCRIPTION OF EMBODIMENT(S)

Embodiments of the present invention will be explained with reference to the accompanying drawings.

In a manufacture method of a semiconductor package according to a first embodiment, an amount of solder provided to a copper-core ball contained in a copper-core solder ball is reduced so that, if the solder is melted within a mold resin, the melted solder does not intrude into a weak adhesion portion or, even if it intrudes, an amount of solder is very small. Thereby, short-circuiting between adjacent connection pads or short-circuiting in a wiring pattern can be prevented. If an amount of solder of the copper-core solder ball is reduced, it may be difficult to join a lower substrate and an upper substrate to each other by soldering. However, electrical conductance can be acquired by filling a mold resin between the upper substrate and the lower substrate to firmly fix the upper substrate and the lower substrate to each other and to cause the copper-core balls of the copper-core solder balls to be brought into close contact with the connection pads.

However, according to a manufacturing method suggested presently, after forming a substrate assembly by integrally joining an upper substrate and a lower substrate by the solder of the copper-core solder balls, a mold resin is filled between the upper substrate and the lower substrate in a state where the substrate assembly is clamped by a mold. In this case, a certain amount of solder is needed to join and integrate the upper substrate and the lower substrate by the solder provided between the upper substrate and the lower substrate. Thus, if an amount of solder is reduced, it may be difficult to join the upper substrate and the lower substrate by the small amount of solder.

Thus, in the manufacturing method according to the present embodiment, an amount of solder of the copper-core solder ball is limited to a minimum amount with which the copper-core ball is joined to a connection pad, and dummy copper-core solder balls are used to join and fix the upper substrate and the lower substrate. Each of the dummy copper-core solder balls is provided with a solder on the circumference of the copper-core ball of which amount is sufficient for joining the upper substrate and the lower substrate as is in the conventional method. Hereinafter, the dummy copper-core solder ball may be referred as a dummy ball. The dummy ball is needed in only a semiconductor package manufacturing process. Thus, the dummy balls are provided outside a semiconductor package, and are removed before the semiconductor package is completed. That is, the dummy ball is not contained in a completed semiconductor package.

Figure 1:
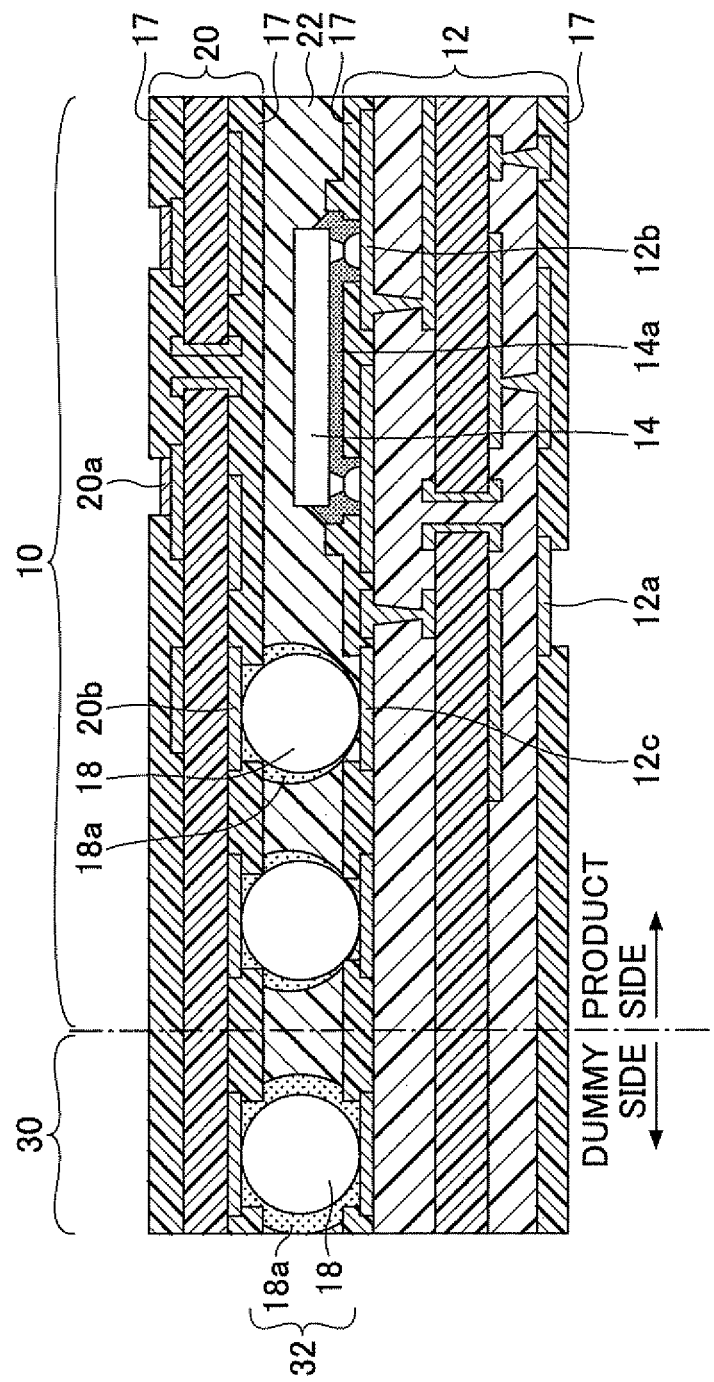
FIG. 1 is a cross-sectional view of a part of a semiconductor package according to a first embodiment.

FIG. 1 is a cross-sectional view of a part of a semiconductor package manufactured by a manufacturing method according to a first embodiment.

A semiconductor package 10 includes a lower substrate 12 and a semiconductor element 14 mounted on the lower substrate 12. The semiconductor element 14 is flip-chip mounted on a mount surface of the lower substrate 12, and an underfill material 14a is filled between the semiconductor element 14 and the lower substrate 12. The lower substrate 12 is a multilayer substrate formed of, for example, a glass-epoxy, etc. External connection pads 12a are electrically connected, by wirings in the lower substrate 12, to electrode connection pads 12b to which electrode terminals of the semiconductor element 14 are joined. Solder balls are provided to the external connection pads 12a as external connection terminals as mentioned later.

Wiring patterns are formed on each of the front surface and the back surface of the lower substrate 12, and the wiring patterns on the front and back surfaces are electrically connected to each other by through holes penetrating the lower substrate 12. The above-mentioned external connection pads 12a and electrode connection pads 12b and connection pads 12c mentioned below are formed on ends of the wiring patterns.

The upper substrate 20 is connected to the lower substrate 12 via copper-core balls 18 as an example of conductive core balls used as spacer members. Each copper-core ball 18 is provided with a solder 18a on the circumference thereof and is supplied as a copper-core solder ball. Similar to the lower substrate 12, the upper substrate 20 is a multilayer substrate formed of, for example, a glass-epoxy, etc. Parts connection pads 20a are formed on the front surface of the upper substrate 20. The parts connection pads 20a are electrode pads used for mounting electronic parts such as a semiconductor element, a passive element, etc., on the upper substrate 20 as mentioned later.

Wiring patterns are formed on each of the front surface and the back surface of the upper substrate 20, and the wiring patterns on the front and back surfaces are electrically connected to each other by through holes penetrating the upper substrate 20. The above-mentioned parts connection pads 20a and joint pads 20b mentioned below are formed on ends of the wiring patterns.

Joint pads 12c are formed on the mount surface (front surface) of the lower substrate 12, and joint pads 20b are formed at corresponding positions on the back surface of the upper substrate 20. The joint pad 20b formed on the back surface of the upper substrate 20 and the copper-core ball 18 are joined by solder 18a provided on the circumference of the copper-core ball 18. On the other hand, the joint pad 12c formed on the mount surface of the lower substrate 12 and the copper-core ball 18 are not joined by the solder 18a but the copper-core ball 18 is merely brought into pressure-contact with the joint pad 12c. That is, an amount of the solder 18a provided on the circumference of the copper-core ball 18 is so small that the copper-core ball 18 is joined only to the joint pad 20b formed on the back surface of the upper substrate 20.

A mold resin 22 is filled between the upper substrate 20 and the lower substrate 12 so that the upper substrate 20 is fixed to the lower substrate 12. The distance between the upper substrate 20 and the lower substrate 12 is maintained by the copper-core balls 18. Because an amount of the solder 18a confined in the mold resin 22 is small in the present embodiment as mentioned above, if the solder 18a is melted and expanded thermally, the melted solder does not intrude between the mold resin 22 and a solder resist 17 and an under side of the solder resist 17, or even if it intrudes, the amount of the solder is very small and is not an amount that causes a problem such as short-circuit.

In FIG. 1, the dummy part 30 is illustrated outside the semiconductor package 10 for the sake of convenience of explanation. The dummy part 30 is a portion formed at the time of manufacturing the semiconductor package 10, and is finally removed from the semiconductor package 10 by being cut out along a single-dashed chain line of FIG. 1. The dummy part 30 is a portion which is formed by extending the lower substrate 12 and the upper substrate 20 outwardly. In the dummy part 30, dummy balls 32 (second core-containing solder balls), each of which is formed by the copper-core ball 18 and a relatively large amount of solder 18a, are arranged between the lower substrate 12 and the upper substrate 20. The amount of the solder 18a in the dummy balls 32 arranged in the dummy part 30 is sufficient for joining the joint pads 12c of the lower substrate 12 and the joint pads 20b of the upper substrate 20. Accordingly, the amount of the solder of the dummy ball 32 is larger than the amount of the solder of the copper-core solder ball 18 provided in the semiconductor package 10. In the manufacturing process, the dummy balls 32 are also embedded into the mold resin 22 in the dummy part 30, but the dummy part 30 is removed by being cut out. Thus, there is no case where a large amount of solder is confined within the mold resin 22 of the semiconductor package 10.

The purpose of providing the dummy part 30 in the manufacturing process is to join and fix the lower substrate 12 and the upper substrate 20 to each other by the solder 18a of the dummy balls 32 until the mold resin 22 is supplied between the lower substrate 12 and the upper substrate 20. After the mold resin 22 supplied between the lower substrate 12 and the upper substrate 20 is cured, the lower substrate 12 and the upper substrate 20 are fixed to each other by an adhesion force of the mold resin 22. Accordingly, there is no need to maintain the lower substrate 12 and the upper substrate 20 being joined by the solder 18a of the dummy balls 32, and, thereby, the dummy part 30 is no longer needed. Thus, the semiconductor package 10 is completed into one from which the dummy part 30 has been cut out and removed.

Next, a description will be given of a manufacturing method of the semiconductor package according to the present embodiment as illustrated in FIG. 1.

Figure 2A:
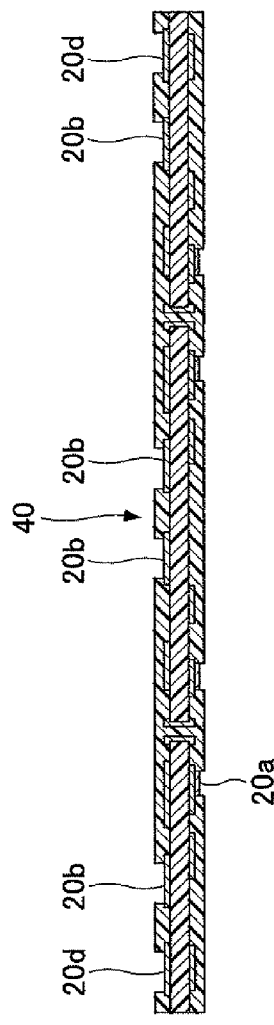
FIG. 2A is a cross-sectional view of an upper-substrate substrate material in a preparation process.
Figure 2B:
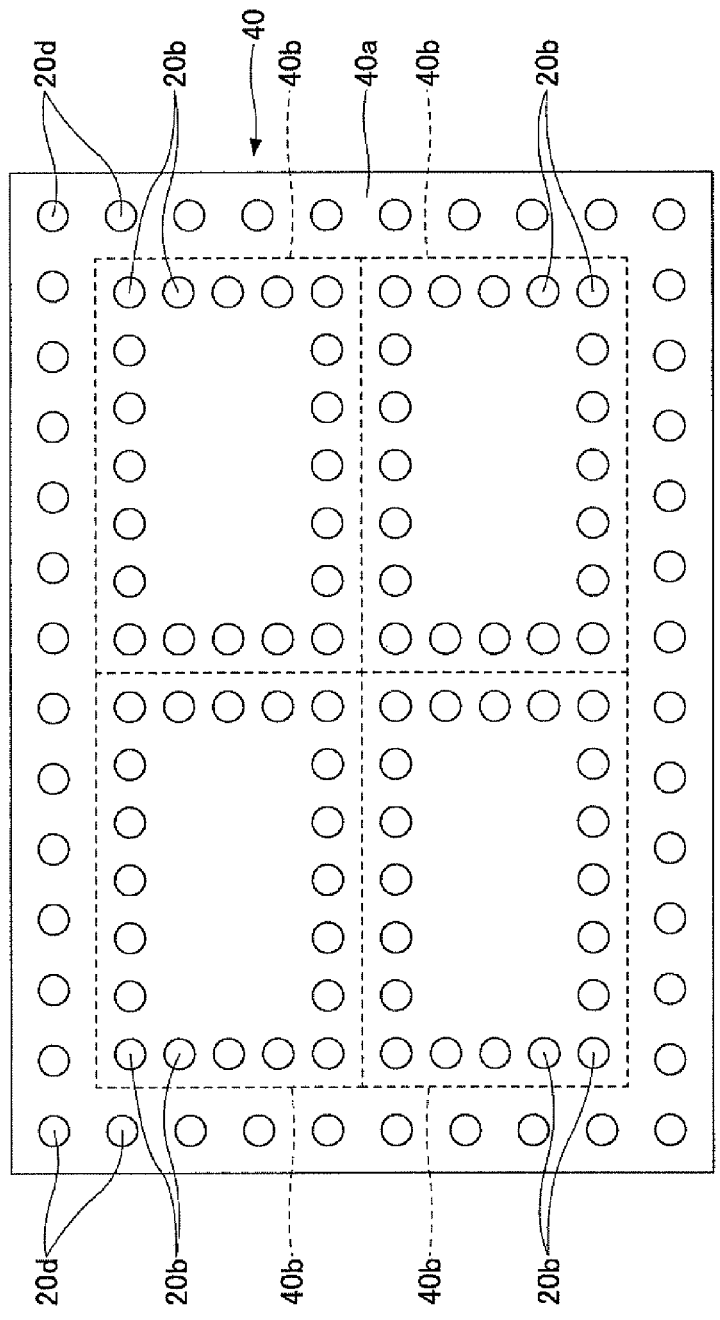
FIG. 2B is a plan view of the upper-substrate substrate material illustrated in FIG. 2A.

First, an upper-substrate substrate material 40 for forming the upper substrate 20 (hereinafter, referred to as a substrate material 40) is prepared as illustrated in FIGS. 2A and 2B.

FIG. 2A is a cross-sectional view of the substrate material 40. FIG. 2B is a plan view illustrating a back surface of the substrate material 40. The substrate material 40 is a single sheet of material for forming a plurality of sheets of upper substrate (four sheets in the present embodiment). Areas 40b corresponding to the four sheets of upper substrate 20 are aligned in the central part of the substrate material 40, and an extending part 40a for forming the dummy part 30 extends in the periphery thereof.

That is, a single sheet of the substrate material 40 includes areas 40b corresponding to four sheets of upper substrate 20 as illustrated by dashed lines, and the frame-shaped extending part 40a extends from the areas 40b. The joint pads 20b are formed in the areas 40b corresponding to the upper substrates 20 on the back surface of the substrate material 40. On the other hand, joint pads 20d to which the dummy balls 32 are joined are formed in the extending part 40a. The parts connection pads 20a are formed in the areas 40b on the front surface of the substrate material 40.

Although the parts connection pads 20a and the joint pads 20b that are to be provided in the semiconductor package 10 are connected to wiring patterns, the joint pads 20d arranged on the extending part 40a, which is to be formed into the dummy part 30, are not connected to wiring patterns and preferably isolated from each other. That is, because the joint pads 20d are not used for achieving electrical connection, there is no need to connect wiring patterns to the joint pads 20d. However, the joint pads 20d arranged on the extending part 40a may be connected to each other if they are not connected to a portion having an electric function such as the joint pad 20b.

Figure 3A:
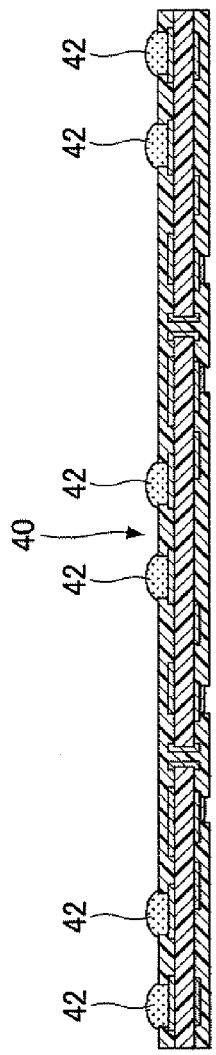
FIG. 3A is a cross-sectional view of the upper-substrate substrate material in a flux applying process.
Figure 3B:
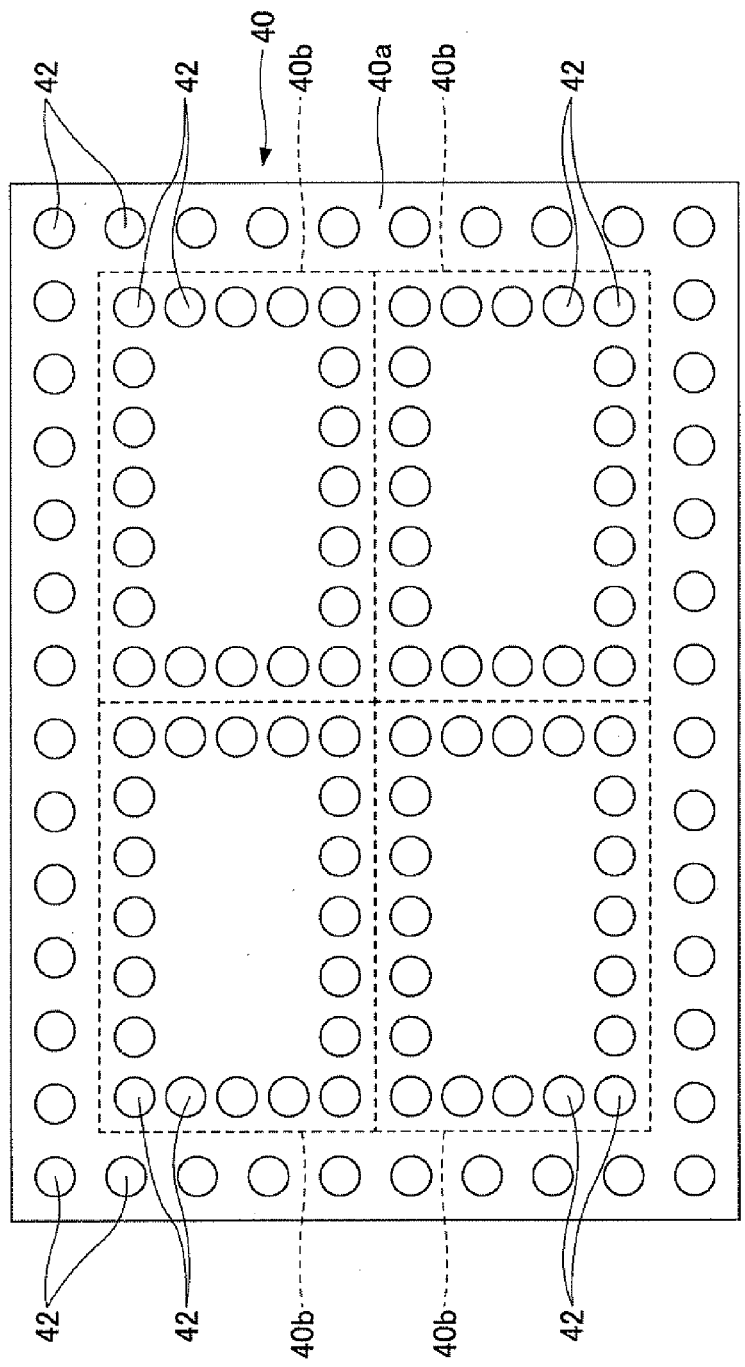
FIG. 3B is a plan view of the upper-substrate substrate material illustrated in FIG. 3A.

After the substrate material 40 illustrated in FIGS. 2A and 2B is prepared, a flux 42 is applied onto the joint pads 20b and the joint pads 20d on the back surface of the upper substrate 20 as illustrated in FIGS. 3A and 3B. FIG. 3A is a cross-sectional view of the substrate material 40. FIG. 3B is a plan view illustrating the back surface of the substrate material 40. The flux 42 is provided to facilitate solder joining.

Then, as illustrated in FIGS. 4A and 4B, dummy balls 32 are mounted on the joint pads 20d on the back surface of the extending part 40a of the substrate material 40. FIG. 4A is a cross-sectional view of the substrate material 40. FIG. 4B is a plan view illustrating the back surface of the substrate material 40. The dummy ball 32 as a second core-containing solder ball is formed by applying the solder 18a on the circumference of the copper-core ball 18. An amount of the solder 18a of the dummy ball 32 is relatively large and is sufficient for solder-joining the joint pad 20d of the substrate material 40 and a joint pad of a lower-substrate substrate material mentioned later.

Next, as illustrated in FIGS. 5A and 5B, the copper-core solder balls 34 are mounted onto the joint pads 20b provided in the areas 40b of the back surface of the substrate material 40. FIG. 5A is a cross-sectional view of the substrate material 40. FIG. 5B is a plan view illustrating the back surface of the substrate material 40. The copper-core solder ball 34 as a first core-containing solder ball is formed by applying the solder 18a on the circumference of the copper-core ball 18 as mentioned above. An amount of the solder 18a of the copper-core solder ball 34 is very small and is sufficient but not excessive for solder-joining the solder-core ball 18 to the joint pad 20b of the substrate material 40.

The preparation of the upper-substrate substrate material 40 for forming the upper substrate 12 is completed as mentioned above.

Next, a description will be given, with reference to FIGS. 6A and 6B and FIGS. 7A and 7B, of preparation of a lower-substrate substrate material (hereinafter, referred to as a substrate material 50) for forming the lower substrate 12.

FIG. 6A is a cross-sectional view of the substrate material 50. FIG. 6B is a plan view illustrating the front surface of the substrate material 50. The substrate material 50 is a single sheet of material for forming a plurality of sheets of the lower substrate 12. In FIGS. 6A and 6B, areas 50b corresponding to four sheets of the lower substrate 12 are arranged in the center part of the substrate material 50, and an extending part 50a for forming the dummy part 30 extends in the circumference of the areas 50b. The four areas 50b correspond to the above-mentioned four areas 40b of the substrate material 40, respectively. In FIGS. 6A and 6B, only a portion where the four areas are formed is illustrated. However, the portion illustrated in FIGS. 6A and 6B may be a part of the substrate material 50, and the substrate material 50 may be elongated like a belt-shape and the assembly of four areas 50b may be consecutively arranged along the belt-shaped substrate material 50. Additionally, the extending part 50a of the substrate material 50 is preferably larger than the extending part 40a of the substrate material 40 to be combined with the substrate material 50. By making the extending part 50a of the substrate material 50 larger than the extending part 40a of the substrate material 40, positioning holes or the like used when conveying the substrate material 50 can be provided in an outer edge portion of the extending part 50a.

As mentioned above, one sheet of the substrate material 50 includes areas 50b corresponding to four sheets of the lower substrate 12 as illustrated by dashed lines in FIG. 6B, and the frame-shaped extending part 50a extends in the circumference of the areas 50b. The joint pads 12c are formed in the areas 50b corresponding to the upper substrates 12 on the front surface of the substrate material 50. The electrode connection pads 12b to be connected to the electrode terminals of the semiconductor element 14 are formed in the center portion of each area 50b on the front surface of the substrate material 50. On the other hand, the joint pads 12d to which the dummy balls 32 are joined are formed on the front surface side of the extending part 50a.

Although the joint pads 12c, which are to be provided in the semiconductor package 10, are connected to wiring patterns, the joint pads 12d arranged in the extending part 50a, which is formed into the dummy part 30, are not connected to wiring patterns and are isolated from each other. That is, because the joint pads 12d are not for making an electric connection, there is no need to connect with wiring patterns or the like. However, the joint pads 12c arranged in the extending part 50a may be connected to each other if they are not connected to a part providing an electric function, such as the connection pad 12b.

The semiconductor element 14 is flip-chip mounted to each of the areas 50b on the front surface of the substrate material 50 having the above-mentioned structure as illustrated in FIGS. 6A and 6B. That is, the electrodes of the semiconductor element 14 are joined to the electrode connection pads 12b formed in each area 50b on the front surface of the substrate material 50, and an underfill material 14a is filled between the semiconductor element 14 and the substrate material 50 to fix the semiconductor element 14 to the substrate material 50.

After mounting the semiconductor element 14 to each of the areas 50b of the substrate material 50, a flux 52 is applied to the joint pads 20d (pads to which the dummy ball 32 are joined) formed on the front surface of the extending part 50 as illustrated in FIGS. 7A and 7B. FIG. 7A is a cross-sectional view of the substrate material 50. FIG. 7B is a plan view illustrating the front surface of the substrate material 50.

The preparation of the lower-substrate substrate material 50 is completed according to the above-mentioned processes.

Then, as illustrated in FIGS. 8A and 8B, the upper-substrate substrate material 40 prepared according to the processes mentioned above is mounted onto the thus-prepared lower-substrate substrate material 50. The substrate material 40 is arranged in a position where the four areas 40b of the substrate material 40 are aligned with the four areas 50b of the substrate material 50 in a vertical direction, respectively. Accordingly, the dummy balls 32 joined to the joint pads 20d formed on the extending part 40a of the upper-substrate substrate material 40 are arranged on the joint pads 12d formed on the extending part 50a of the lower-substrate substrate material 50. Accordingly, the copper-core solder balls 34 joined to the joint pads 20b formed in the areas 40b of the upper-substrate substrate material 40 are placed on the joint pads 12c formed in the areas 50b of the lower-substrate substrate material 50, respectively. FIG. 8A is a cross-sectional view of the substrate material 40 and the substrate material 50. FIG. 8B is a plan view illustrating the front surface of the substrate material on which the substrate material 40 is mounted. In FIG. 8B, the dummy balls 32, the copper-core solder balls 34 and the semiconductor elements 14, which are located on the under side of the substrate material 40, are illustrated by dashed lines inside the substrate material 40.

As illustrated in FIG. 8A, the substrate material 40 is arranged on the substrate material 50 in a state where the dummy balls 32 and the copper-core solder balls 34 are interposed between the substrate material 40 and the substrate material 50 so that a gap is formed between the substrate material 40 and the substrate material 50 due to the dummy balls 32 and the copper-core solder balls 34. The semiconductor element 14 mounted on each of the areas 50a is accommodated in the gap between the substrate material 40 and the substrate material 50.

Then, the thus-combined substrate material 50 and substrate material 40 are heated in a reflow furnace. Thereby, the solder 18a of the dummy balls 32 is melted and the joint pads 20d of the substrate material 40 and the joint pads 12d of the substrate material 50 are solder-joined to each other. At this time, the solder of the copper-core solder balls 34 is also melted. However, because an amount of solder of the copper-core solder ball 34 is small, the melted solder is maintained in the location between the joint pads 20b of the substrate material 20b and the copper-core balls 18 and is not moved toward the joint pads 12c of the substrate material 50. Thus, in the portion where the copper-core solder balls 34 are interposed, the copper-core solder balls 18 are not solder-joined to the joint pads 12c and are in contact with and pressed against the joint pads 12c. On the other hand, in the portion where the dummy balls 32 are interposed, because an amount of solder is large, the melted solder flows along the surfaces of the copper-core balls 18 and moves to the joint pads 12c and the joint pads 20b, thereby solder-joining the joint pads 12d and the joint pads 20b, respectively.

Although the solder reflow is performed while the substrate material 40 is pressed against the substrate material 50, the interval between the substrate material 40 and the substrate material 50 is maintained at a predetermined distance because the copper-core balls 18 of the dummy balls 32 and the copper-core balls 18 of the copper-core solder balls 34 serve as spacer members. The copper-core ball 18 of the dummy ball 32 and the copper-core ball 18 of the copper-core solder ball 34 are identical copper-core balls, and the outer diameters thereof are equal to each other. Thus, the distance between the back surface of the substrate material 40 and the front surface of the substrate material 50 can be made entirely uniform.

The substrate material 40 is fixed to the substrate material 50 as mentioned above. That is, because the joint pads 20d and the joint pads 12d are solder-joined by the solder 18a of the dummy balls 32 between the extending part 40b of the substrate material 40 and the extending part 50b of the substrate material 50, the substrate material 40 can be surely fixed to the substrate material 50. In this state, the substrate material 50 having the substrate material 40 fixed thereto is carried to a resin encapsulating apparatus. Although the substrate material 40 is thin and easily cracked, the substrate material 40 can be easily handled and carried without a problem such as substrate cracking because the substrate material 40 is fixed to the substrate material 50.

Figure 9:
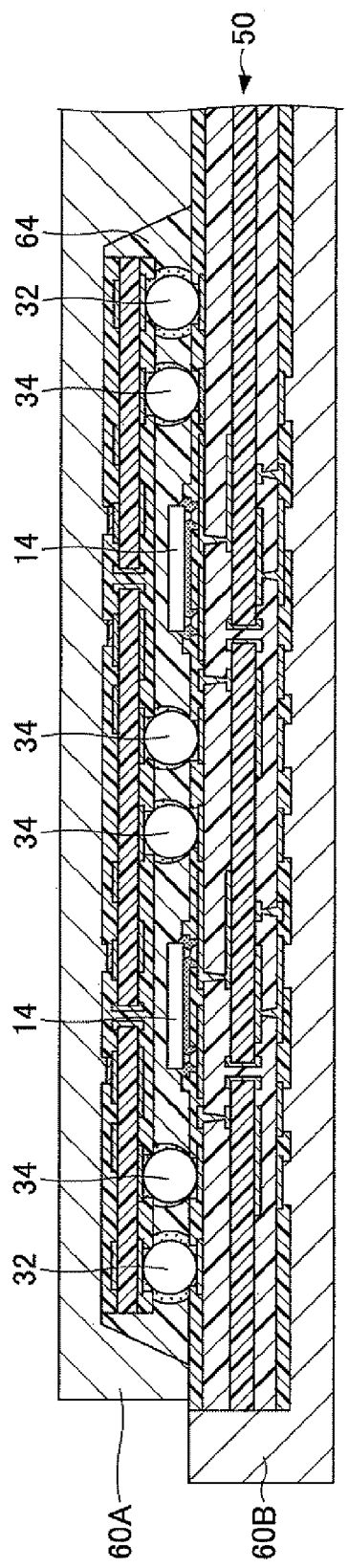
FIG. 9 is a cross-sectional view of the assembly of the lower-substrate substrate material and the upper-substrate substrate material in a mold resin supplying process.

In the resin encapsulation apparatus, as illustrated in FIG. 9, the substrate material 50 having the substrate material 40 fixed thereto is clamped by upper and lower molds 60A and 60B, and a mold resin 22 is supplied between the substrate material 40 and the substrate material 50. The mold resin 22 is supplied and cured while the substrate material 40 is pressed against the substrate material 50 by the upper mold 60A. A seal resin part 64 is formed by the mold resin 22 being cured. As illustrated in FIG. 9, the semiconductor elements 14 are embedded in the seal resin part 64, and the dummy balls 32 and the copper core solder balls 34 are also embedded in the real resin part 64. In this state, the copper core balls 18 of the copper-core solder balls 34 are in contact with and pressed against the joint pads 12c of the substrate material 50 due to an adhesion force of the seal resin part 64. Thereby, the joint pads 20b of the substrate material 40 are electrically connected to the joint pads 12c of the substrate material 50 surely via the copper-core balls 18.

In addition, although according to the present embodiment the amount of solder 18a of the copper-core solder ball 34 is set to an amount with which the solder, even if it is melted by reflowing, does not flow to the joint pads 12d of the substrate material 50, the amount of solder may be set to the extent that a very small amount of solder flows to the joint pads 12d. In such a case, the copper-core balls 18 are also solder-joined to the joint pads 12d, but no problem may be caused, even if the solder is embedded in the seal resin part 64, by reducing the amount of the solder of the copper-core solder ball 34 to an amount smaller than that of the dummy ball 32.

After the supplied mold resin 22 is cured and the seal resin part 64 is formed, the upper and lower molds 60A and 60B are opened and the substrate material 50 is taken out. Then, as illustrated in FIG. 10, solder balls are provided to the external connection pads 12a of the back surface of the substrate material 50, and the solder balls are subjected to reflow to form bumps 66 as external connection terminals.

Figure 10:
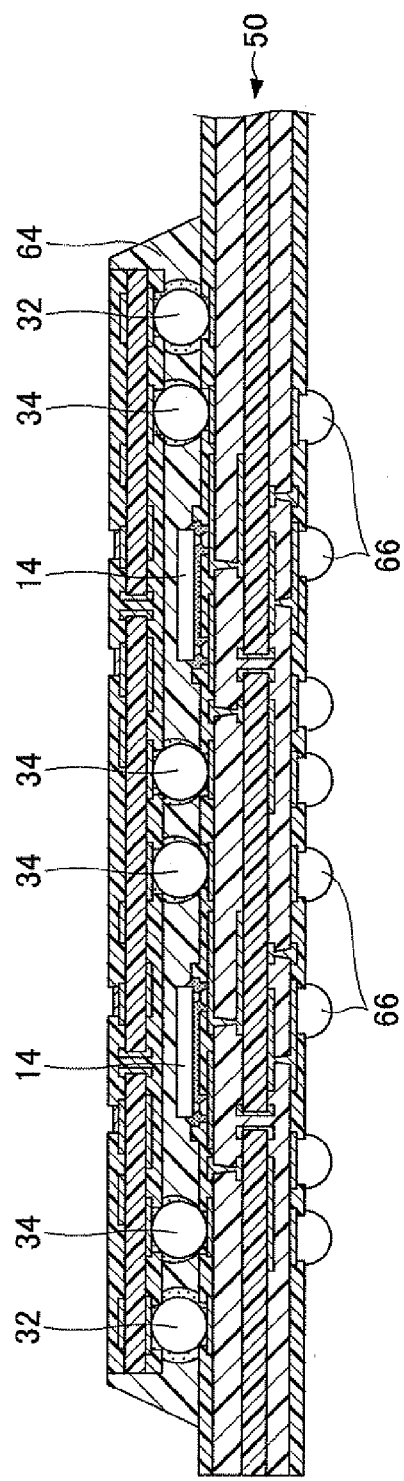
FIG. 10 is a cross-sectional view of the assembly of the lower-substrate substrate material and the upper-substrate substrate material in an external connection terminal forming process.

In the state illustrated in FIG. 10, four semiconductor packages connected by the seal resin part 64 are formed by the four areas 40b of the upper-substrate substrate material 40 and the four areas 50b of the lower-substrate substrate material 50. The dummy part 30 is formed in the circumference of the four semiconductor packages.

Then, the dummy part 30 is separated from the four semiconductor packages 10, and the four semiconductor packages 10 are divided into individual pieces. That is, as illustrated in FIG. 11, first the dummy part 30 is removed by cutting by dicing along lines (corresponding to boundaries between the areas 40b and the extending part 40a) between the dummy part 30 and the semiconductor packages 10. The substrate material 40 and the substrate part 50 are not separated from each other even if the dummy part 30 is cut out because the substrate material 40 is firmly fixed to the substrate material 50 by the seal resin part 64. Thereafter, the semiconductor packages 10 are individualized by cutting by dicing along lines (boundaries between the four areas 40b) between the four semiconductor packages 10 as illustrated in FIGS. 11A and 11B.

According to the above-mentioned processes, four pieces of the semiconductor package 10 can be collectively manufactured. The number of semiconductor packages collectively manufactured is not limited to four pieces, and an arbitrary number of pieces of semiconductor packages can be collectively manufactured to the extent that the substrate material 40 and the substrate material 50 are prepared.

In the semiconductor package 10 manufactured by the manufacturing method explained above, the mold resin is filled between the upper substrate 20 and the lower substrate 12 so that the upper substrate 20 is fixed to the lower substrate 12. The distance between the upper substrate 20 and the lower substrate 12 is maintained by the copper-core balls 18. As mentioned above, according to the present embodiment, because the dummy part 30, in which the dummy balls 32 having a large amount of solder are provided, is removed, the amount of solder confined within the seal resin part 64 is small. Thus, if the solder in the seal resin part 64 is melted and expanded, the melted solder does not intrude between the seal resin part 64 and a wiring pattern, or even if it intrudes, the amount of solder is very small, which does not cause a problem such as a short-circuit.

Although the copper-core ball 18 formed of copper is used as a conductive core ball which serves as a spacer member in the present embodiment, the material of the conductive core ball is not limited to copper. For example, a conductive core ball formed of a metal such as gold or nickel may be used instead of the copper-core ball 18. The copper-core ball 18 used in the dummy ball 32 is not necessarily identical to the copper-core ball 18 used in the copper-core solder ball 34. Because the copper-core ball 18 used in the dummy ball 32 is not used to make an electrical connection, it is not necessary to have a low resistance. Thus, the copper-core ball 18 used in the dummy ball 32 can be a conductive core ball formed of other metals such as nickel or the like, or can be a nonconductive core ball (mere core ball) formed of ceramics or the like.

In the present embodiment, the dummy balls 32 are arranged between the substrate material 40 and the substrate material 50 by joining the dummy balls 32 to the joint pads 20d of the upper-substrate substrate material 40 and thereafter attaching the substrate material 40 to the substrate material 50. However, the dummy balls 32 may be joined previously to the joint pads 12d of the lower-substrate substrate material 50.

A description will be given below of a manufacturing method of a semiconductor package according to a second embodiment.

In the semiconductor package according to the second embodiment, a copper-core ball 18, which is not provided with the solder 18a, is used instead of the dummy ball 32 and the copper-core solder ball 34 according to the first embodiment. Thus, the copper-core balls 18 are joined to the joint pads by a conductive paste such as, for example, a silver paste or a copper paste. The conductive paste is not provided in the circumference of the copper-core ball 18 but can be applied to the joint pad.

Figure 12A:
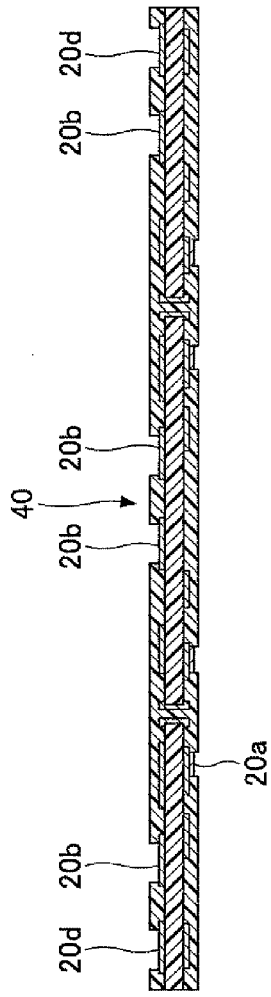
FIG. 12A is a cross-sectional view of an upper-substrate substrate material in a preparation process.
Figure 12B:
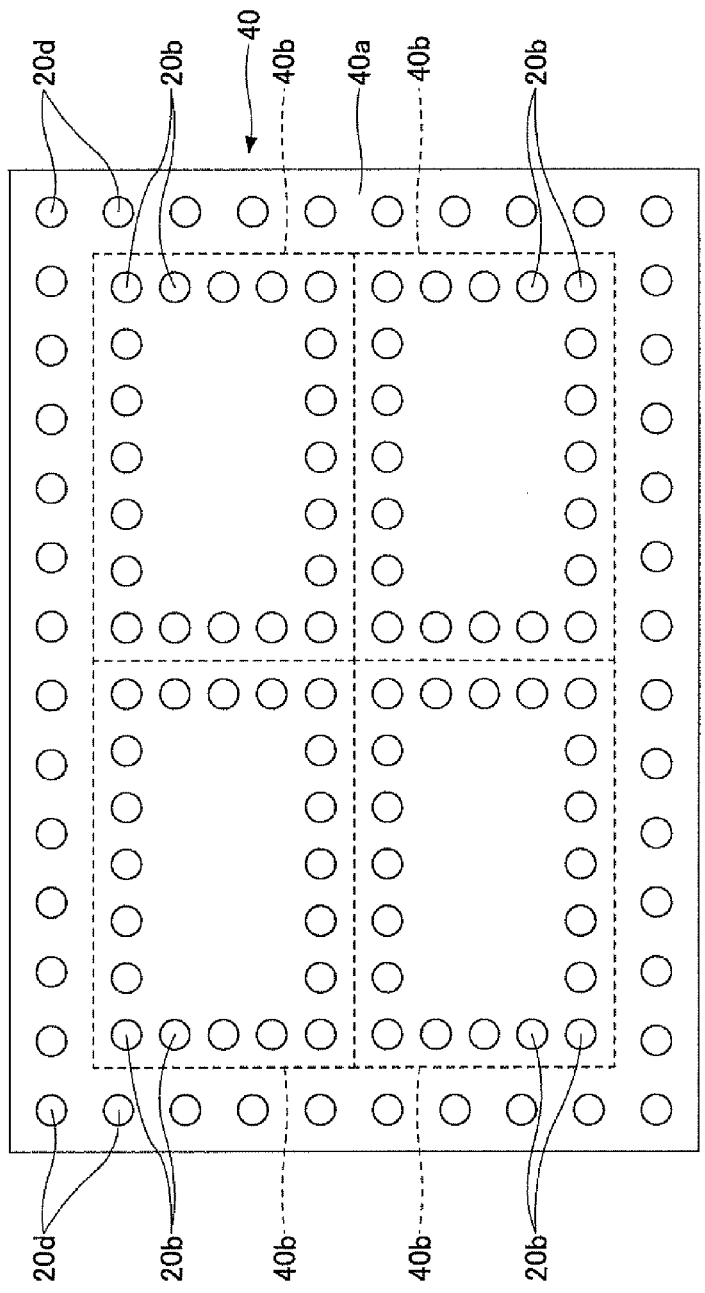
FIG. 12B is a plan view of the upper-substrate substrate material illustrated in FIG. 12A.

First, similar to the first embodiment, as illustrated in FIGS. 12A and 12B, an upper-substrate substrate material 40 (hereinafter, referred to as substrate material 40) for forming an upper substrate 20 is prepared. FIG. 12A is a cross-sectional view of the substrate material 40. FIG. 12B is a plan view illustrating a back surface of the substrate material 40. In the description given below, parts that are the same as the parts in the first embodiment are given the same reference numerals, and descriptions thereof will be omitted. Additionally, descriptions of manufacturing processes the same as the manufacturing processes in the first embodiment are omitted.

Figure 13A:
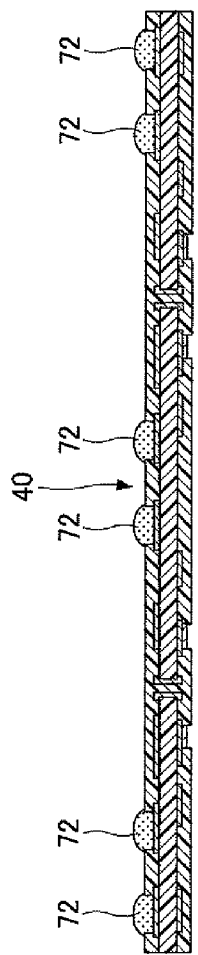
FIG. 13A is a cross-sectional view of the upper-substrate substrate material in a conductive paste applying process.
Figure 13B:
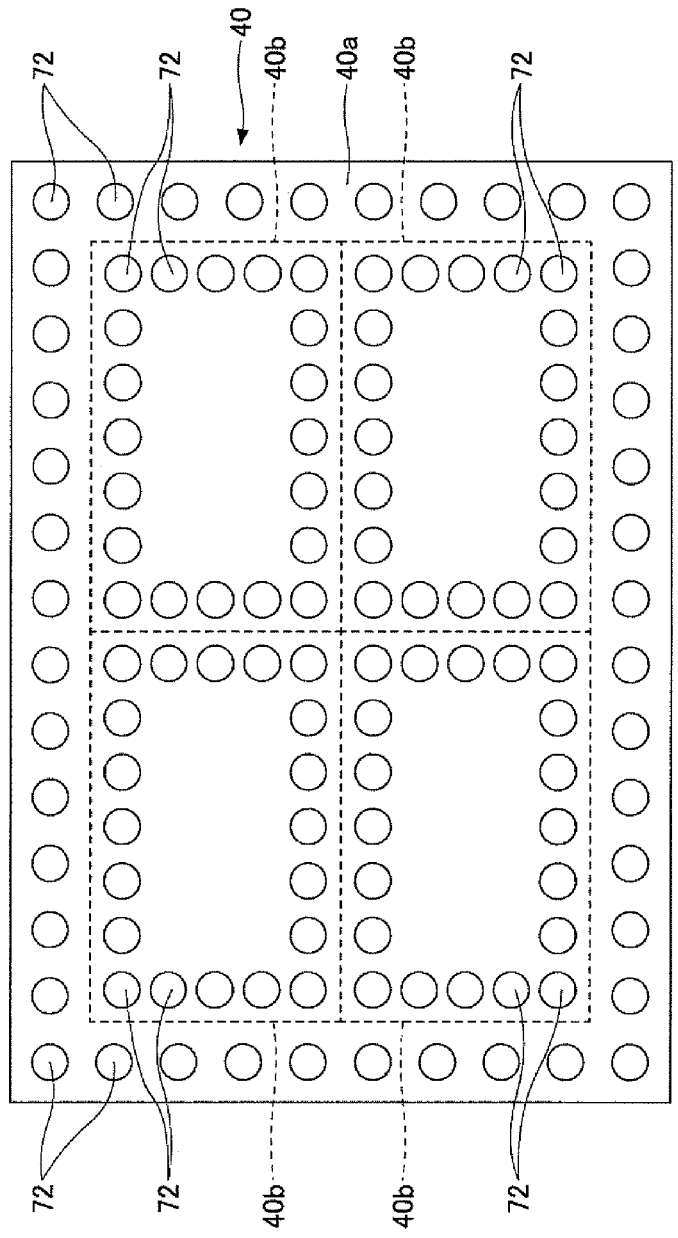
FIG. 13B is a plan view of the upper-substrate substrate material illustrated in FIG. 13A.

After preparing the substrate material 40 illustrated in FIGS. 12A and 12B, a conductive paste 72 is applied onto the joint pads 20b and the joint pads 20d of the back surface of the substrate material 40 as illustrated in FIGS. 13A and 13B. FIG. 13A is a cross-sectional view of the substrate material 40. FIG. 13B is a plan view illustrating a back surface of the substrate material 40. The conductive paste 72 is provided to join the copper-core ball 18.

Figure 14A:
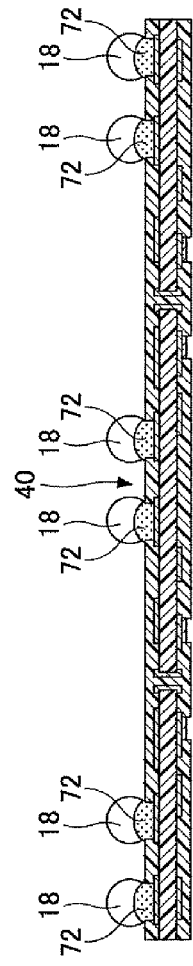
FIG. 14A is a cross-sectional view of the upper-substrate substrate material in a copper-core ball mounting process.
Figure 14B:
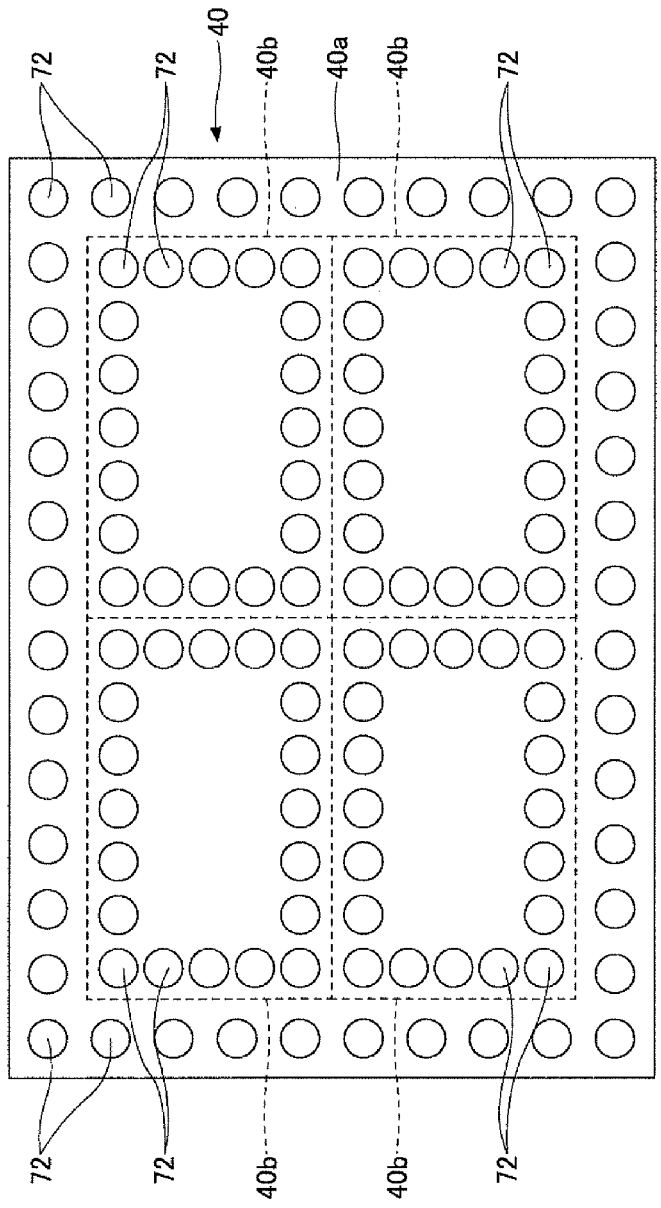
FIG. 14B is a plan view of the upper-substrate substrate material illustrated in FIG. 14A.

Then, as illustrated in FIGS. 14A and 14B, the copper-core balls 18 are arranged on the conductive paste 72 provided on each of the joint pads 20d and the joint pads 20b of the substrate material 40. The copper-core balls 18 are joined to the joint pads 20d and the joint pads 20b by the conductive paste 72 by curing the conductive paste 72 at a normal temperature or heating to cure the conductive paste 72. FIG. 14A is a cross-sectional view of the substrate material 40. FIG. 14B is a plan view illustrating a back surface of the substrate material 40.

According to the above-mentioned processes, the preparation of the upper-substrate substrate material 40, which is used for forming the upper substrate 20, is completed.

A description will be given below, with reference to FIGS. 15A, 15B, 16A and 16B, of preparation of a lower-substrate substrate material (hereinafter, referred to as a substrate material 50) for forming the lower substrate 12.

FIG. 15A is a cross-sectional view of the substrate material 50. FIG. 15B is a plane view illustrating a front surface of the substrate material 50. First, as illustrated in FIGS. 15A and 15B, the semiconductor elements 14 are flip-chip mounted onto the substrate material 50, and an underfill material 14a is filled between each of the semiconductor chips 14 and the substrate material 50 to fix the semiconductor elements 14 to the substrate material 50.

Figure 16A:
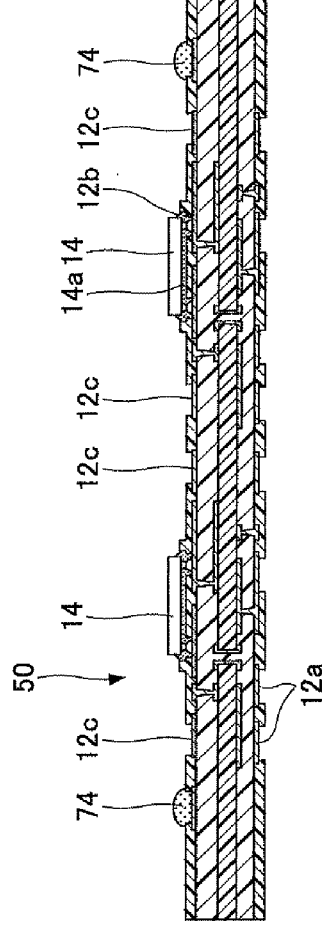
FIG. 16A is a cross-sectional view of the lower-substrate substrate material in a solder paste applying process.
Figure 16B:
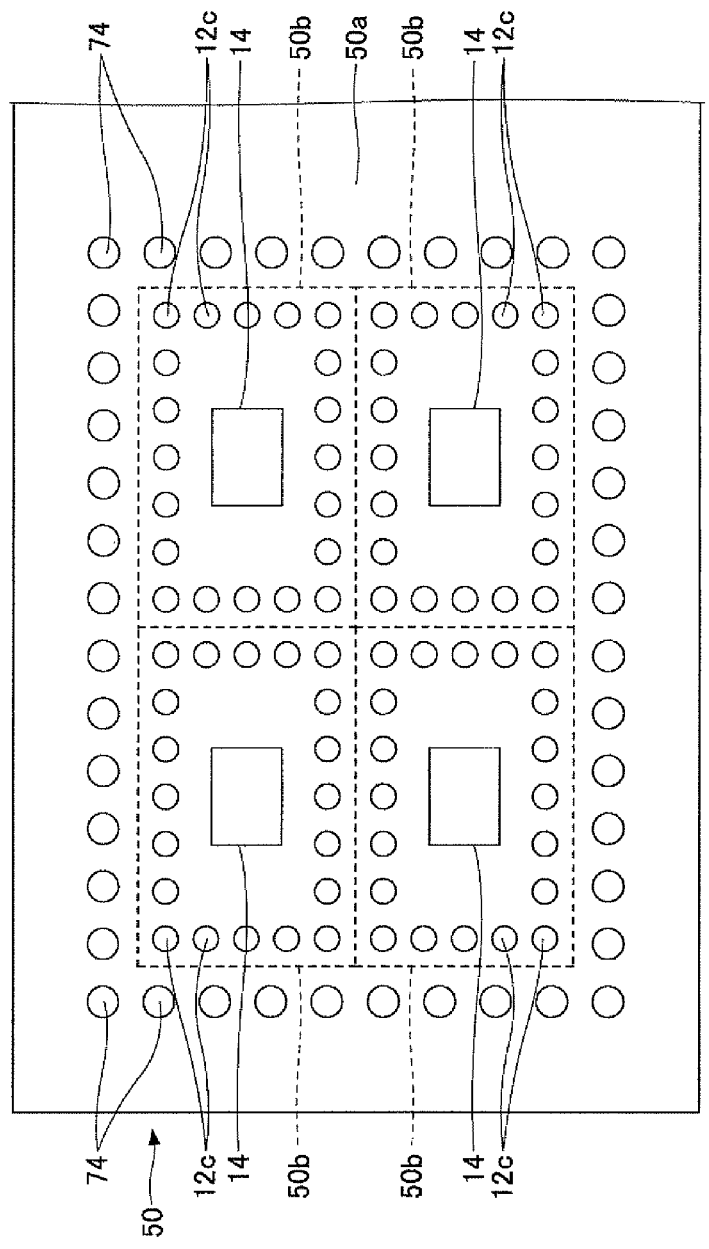
FIG. 16B is a plan view of the lower-substrate substrate material illustrated in FIG. 16A.

After mounting the semiconductor element 14 in each of the areas 50a of the substrate material 50, a paste 74 is applied onto the joint pads 20d formed on the front surface of the extending part 50a. FIG. 16A is a cross-sectional view of the substrate material 50. FIG. 16B is a plan view illustrating the front surface of the substrate material 50.

According to the above-mentioned processes, the preparation of the lower-substrate substrate material 50 is completed.

Then, as illustrated in FIGS. 17A and 17B, the upper-substrate substrate material 40 prepared according to the processes mentioned above is mounted onto the thus-prepared lower-substrate substrate material 50. The substrate material 40 is arranged in a position where the four areas 40b of the substrate material 40 are aligned with the four areas 50b of the substrate material 50 in a vertical direction, respectively. Accordingly, the copper-core balls 18 joined to the joint pads 20d formed on the extending part 40b of the upper-substrate substrate material 40 are arranged on the joint pads 12d formed on the extending part 50a of the lower-substrate substrate material 50. Accordingly, the copper-core balls 18 joined to the joint pads 20b formed in the areas 40b of the upper-substrate substrate material 40 are placed on the joint pads 12c formed in the areas 50b of the lower-substrate substrate material 50, respectively. FIG. 17A is a cross-sectional view of the substrate material 40 and the substrate material 50. FIG. 17B is a plan view illustrating the front surface of the substrate material on which the substrate material 40 is mounted. In FIG. 17B, the copper-core balls 18 and the semiconductor elements 14, which are located on the under side of the substrate material 40, are illustrated by dashed lines inside the substrate material 40.

As illustrated in FIG. 17A, the substrate material 40 is arranged on the substrate material 50 in a state where the copper-core balls 18 are interposed between the substrate material 40 and the substrate material 50 so that a gap is formed between the substrate material 40 and the substrate material 50 due to the copper-core balls 18. The semiconductor element 14 mounted on each of the areas 50a is accommodated in the gap between the substrate material 40 and the substrate material 50.

Then, the thus-combined substrate material 50 and substrate material 40 are heated in a reflow furnace. Thereby, the solder paste 74 on the joint pads 12d is melted and the joint pads 12d of the substrate material 50 and the copper-core balls 18 are solder-joined to each other. Because the copper-core balls 18 solder-joined to the joint pads 12d are joined to the joint pads 20d of the substrate material 40 by the conductive paste 72 at the stage of preparing the substrate material 40, the joint pads 20d of the substrate material 40 and the joint pads 12d of the substrate material 50 are joined to each other via the copper-core balls 18. Accordingly, the substrate material 40 is fixed to the substrate material 50.

Figure 18:
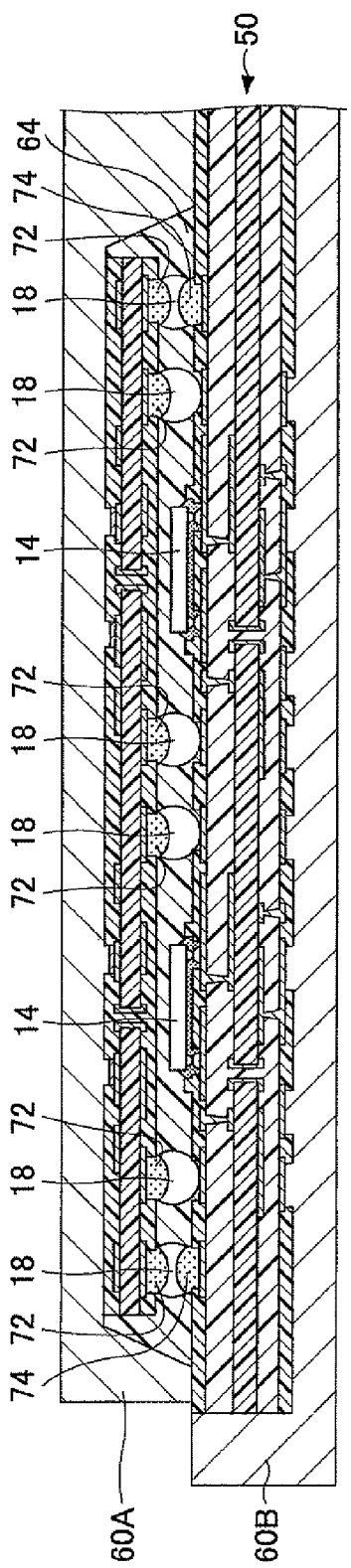
FIG. 18 is a cross-sectional view of the assembly of the lower-substrate substrate material and the upper-substrate substrate material in a mold resin supplying process.

Thereafter, similar to the above-mentioned first embodiment, in the resin encapsulation apparatus, as illustrated in FIG. 18, the substrate material 50 having the substrate material 40 fixed thereto is clamped by upper and lower molds 60A and 60B, and a mold resin 22 is supplied between the substrate material 40 and the substrate material 50. The mold resin 22 is supplied and cured while the substrate material 40 is pressed against the substrate material 50 by the upper mold 60A. A seal resin part 64 is formed by the mold resin 22 being cured. As illustrated in FIG. 18, the semiconductor elements 14 are embedded in the seal resin part 64, and the copper-core balls 18 are also embedded in the seal resin part 64. In this state, the copper-core balls 18 joined to the joint pads 20b of the substrate material 40 are in contact with and pressed against the joint pads 12c of the substrate material 50 due to an adhesion force of the seal resin part 64. Thereby, the joint pads 20b of the substrate material 40 are electrically connected to the joint pads 12c of the substrate material 50 surely via the copper-core balls 18.

After the supplied mold resin 22 is cured and the seal resin part 64 is formed, the upper and lower molds 60A and 60B are opened and the substrate material 50 is taken out. Then, as illustrated in FIG. 19, solder balls are provided to the external connection pads 12a of the back surface of the substrate material 50, and the solder balls are subjected to reflow to form bumps 66 as external connection terminals.

Figure 19:
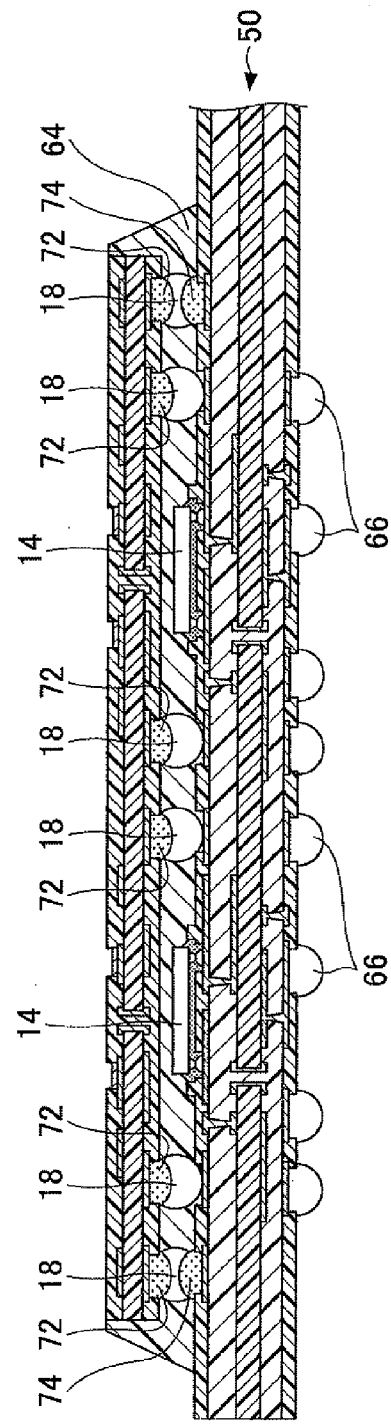
FIG. 19 is a cross-sectional view of the assembly of the lower-substrate substrate material and the upper-substrate substrate material in an external connection terminal forming process.

In the state illustrated in FIG. 19, four semiconductor packages connected by the seal resin part 64 are formed by the four areas 40b of the upper-substrate substrate material 40 and the four areas 50b of the lower-substrate substrate material 50. The dummy part 30 is formed in the circumference of the four semiconductor packages.

Then, the dummy part 30 is separated from the four semiconductor packages 80, and the four semiconductor packages 80 are divided into individual pieces. That is, as illustrated in FIG. 20, first the dummy part 30 is removed by cutting by dicing along lines (corresponding to boundaries between the areas 40b and the extending part 40a) between the dummy part 30 and the semiconductor packages 80. The substrate material 40 and the substrate part 50 are not separated from each other even if the dummy part 30 is cut out because the substrate material 40 is firmly fixed to the substrate material 50 by the seal resin part 64. Thereafter, the semiconductor packages 80 are individualized by cutting by dicing along lines (boundaries between the four areas 40b) between the four semiconductor packages 10 as illustrated in FIGS. 20A and 20B.

According to the above-mentioned processes, four pieces of the semiconductor package 80 can be collectively manufactured. The number of semiconductor packages 80 collectively manufactured is not limited to four pieces, and an arbitrary number of pieces of semiconductor packages can be collectively manufactured to the extent that the substrate material 40 and the substrate material 50 are prepared.

In the semiconductor package 80 manufactured by the manufacturing method explained above, the mold resin is filled between the upper substrate 20 and the lower substrate 12 so that the upper substrate 20 is fixed to the lower substrate 12. The distance between the upper substrate 20 and the lower substrate 12 is maintained by the copper-core balls 18. As mentioned above, according to the present embodiment, because solder is not provided in the seal resin part 64 of the semiconductor package 80, a melted solder does not intrude between the seal resin art 64 and a wiring pattern, and, thus, there is no problem caused by the solder in the seal resin part 64.

Although the copper-core ball 18 formed of copper is used as a conductive core ball which serves as a spacer member also in the present embodiment, the material of the conductive core ball is not limited to copper. For example, a conductive core ball formed of a metal such as gold or nickel may be used instead of the copper-core ball 18. The copper-core ball 18 used in the dummy part 30 is not necessarily identical to the copper-core ball 18 used in the copper-core ball 18 used in the semiconductor package 80. Because the copper-core ball 18 provided in the dummy part 30 is not used to make an electrical connection, it is not necessary to have a low resistance. Thus, the copper-core ball 18 used in the dummy part 30 can be a conductive core ball formed of other metals such as nickel or the like, or can be a non-conductive core ball (mere core ball) formed of ceramics or the like.

All examples and conditional language recited herein are intended for pedagogical purposes to aid the reader in understanding the principles of the invention and the concepts contributed by the inventor to furthering the art, and are to be construed a being without limitation to such specifically recited examples and conditions, nor does the organization of such examples in the specification relates to a showing of the superiority and inferiority of the invention. Although the embodiment(s) of the present invention(s) has(have) been described in detail, it should be understood that the various changes, substitutions, and alterations could be made hereto without departing from the spirit and scope of the invention.

What is claimed is:

1. A manufacturing method of manufacturing a plurality of semiconductor packages at one time, each of the semiconductor packages including:

an upper substrate and a lower substrate connected to each other via spacer members;

a semiconductor element located between the upper substrate and the lower substrate and mounted on said lower substrate; and a mold resin filled in a space between said upper substrate and said lower substrate, the manufacturing method comprising:

preparing an upper-substrate substrate material including said upper substrate and an extending part in a circumference of said upper substrate, joining conductive core balls as said spacer members to joint pads formed on said upper substrate and also joining core balls to joint pads formed on said extending part, and preparing a lower-substrate substrate material including said lower substrate and an extending part in a circumference of said lower substrate;

joining the joint pads formed on said extending part of said upper-substrate substrate material to the joint pads formed on said extending part of said lower-substrate substrate material via said core balls, and connecting said upper-substrate substrate material to said lower-substrate substrate material by electrically connecting the joint pads formed in an area corresponding to said upper substrate of said upper-substrate substrate material to the joint pads formed in an area corresponding to said lower substrate of said lower-substrate substrate material via said core balls and said conductive core balls;

fixing said upper-substrate substrate material to said lower-substrate substrate material by filling a mold resin between said upper-substrate substrate material and said lower-substrate substrate material;

removing a portion including said extending part of said upper-substrate substrate material and said extending part of said lower-substrate substrate material; and individualizing said semiconductor packages.

2. The manufacturing method of semiconductor packages as claimed in claim 1, wherein an amount of solder to join said conductive core balls to the joint pads provided in an area corresponding to said upper substrate in said upper-substrate substrate material is smaller than an amount of solder to join said core balls to the joint pads provided in said extending part of said upper-substrate substrate material.

3. The manufacturing method of semiconductor packages as claimed in claim 2, wherein:

first core-containing solder balls are used to join said conductive core balls to the joint pads provided in the area corresponding to said upper substrate in said upper-substrate substrate material, each first core-containing solder ball containing said conductive core ball and a solder provided on a circumference of said conductive core ball;

second core-containing solder balls are used to join said core balls to the joint pads provided in said extending part of said upper-substrate substrate material, each second core-containing solder ball containing said core ball and a solder provided on a circumference of said core ball;

an amount of the solder of said first core-containing solder ball is set to an amount sufficient for merely solder-joining said conductive core ball to the joint pad of said upper-substrate substrate material; and an amount of the solder of said second core-containing solder ball is set to an amount sufficient for merely solder-joining said core ball to the joint pad of said lower-substrate substrate material.

4. The manufacturing method of semiconductor packages as claimed in claim 1, wherein a conductive paste is used to join said conductive core balls and said core balls to the joint pads provided in said upper-substrate substrate material, and a solder paste is used to join said core balls to the joint pads provided in said extending part of said lower-substrate substrate material.

5. The manufacturing method of semiconductor packages as claimed in claim 1, wherein said upper-substrate substrate material is fixed to said lower-substrate substrate material by said mold resin in a state where said conductive core balls, which are joined to the joint pads provided in the area corresponding to said upper substrate of said upper-substrate substrate material, are in contact with and pressed against the joint pads provided in the area corresponding to said lower substrate of said lower-substrate substrate material.

6. The manufacturing method of semiconductor packages as claimed in claim 1, wherein a portion including said extending part of said upper-substrate substrate material and said extending part of said lower-substrate substrate material is removed by cutting by dicing.

* * * * *